United States Patent
Kiyota et al.

(10) Patent No.: US 9,484,383 B2
(45) Date of Patent: Nov. 1, 2016

(54) SOLID-STATE IMAGE PICKUP DEVICE, METHOD OF MANUFACTURING THEREOF, AND ELECTRONIC APPARATUS

(71) Applicant: Sony Corporation, Tokyo (JP)

(72) Inventors: Yukihiro Kiyota, Tokyo (JP); Keiji Mabuchi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/855,775

(22) Filed: Sep. 16, 2015

(65) Prior Publication Data

US 2016/0005784 A1    Jan. 7, 2016

Related U.S. Application Data

(63) Continuation of application No. 12/929,688, filed on Feb. 9, 2011, now abandoned.

(30) Foreign Application Priority Data

Mar. 24, 2010  (JP) .................................. 2010-068879

(51) Int. Cl.
*H04N 5/76* (2006.01)
*H01L 27/146* (2006.01)
(Continued)

(52) U.S. Cl.
CPC ..... *H01L 27/14643* (2013.01); *H01L 27/1464* (2013.01); *H01L 27/14609* (2013.01); *H01L 27/14612* (2013.01); *H01L 27/14634* (2013.01); *H01L 27/14636* (2013.01); *H01L 27/14689* (2013.01); *H04N 5/369* (2013.01); *H04N 5/378* (2013.01); *H01L 27/14627* (2013.01)

(58) Field of Classification Search
CPC ...................................................... H04N 7/144
USPC .............................. 348/207.1, 222.1, 333.01
See application file for complete search history.

(56) References Cited

U.S. PATENT DOCUMENTS 6,809,769 B1    10/2004  Yang
2003/0025160 A1    2/2003  Suzuki et al.
(Continued)

FOREIGN PATENT DOCUMENTS

JP    2002-044527       2/2002
JP    2003-031785 A     1/2003
(Continued)

OTHER PUBLICATIONS

K. Mizobuchi, et al. "A Very Low Dark Current Temperature-Resistant, Wide Dynamic Range, Complementary Metal Oxide Semiconductor Image Sensor," Japanese Journal of Applied Physics, vol. 47, No. 7, 2008, pp. 5390-5395.
(Continued)

*Primary Examiner* — Joel Fosselman
(74) *Attorney, Agent, or Firm* — Michael Best & Friedrich LLP

(57) ABSTRACT

Provided is a solid-state image pickup device including: a plurality of pixels, each of which includes a photoelectric conversion portion and a pixel transistor formed in a front surface side of a substrate, wherein a rear surface side of the substrate is set as a light receiving plane of the photoelectric conversion portion; and an element, which becomes a passive element or an active element, which is disposed in the front surface side of the substrate so as to be superimposed on the photoelectric conversion portion.

22 Claims, 15 Drawing Sheets

(51) Int. Cl.
*H04N 5/369* (2011.01)
*H04N 5/378* (2011.01)

(56) References Cited

U.S. PATENT DOCUMENTS

| | | |
|---|---|---|
| 2003/0214595 A1 | 11/2003 | Mabuchi |
| 2006/0022910 A1 | 2/2006 | Sekiya et al. |
| 2006/0023109 A1 | 2/2006 | Mabuchi |
| 2006/0197007 A1 | 9/2006 | Iwabuchi et al. |
| 2006/0267913 A1 | 11/2006 | Mochizuki et al. |
| 2008/0106628 A1 | 5/2008 | Cok et al. |
| 2008/0135963 A1 | 6/2008 | Akiyama |
| 2009/0009628 A1 | 1/2009 | Janicek |
| 2009/0146148 A1* | 6/2009 | Pyo .................. H01L 27/14632 257/59 |

FOREIGN PATENT DOCUMENTS

| | | |
|---|---|---|
| JP | 2006-049361 | 2/2006 |
| JP | 2006-245499 | 9/2006 |
| JP | 4123415 | 5/2008 |
| JP | 2008-147333 | 6/2008 |

OTHER PUBLICATIONS

S. Kawada, et al., "A Color-Independent Saturation, Linear Response, Wide Dynamic Range CMOS Image Sensor with Retinal Rod- and Cone-like Color Pixels," 2009 Symposium on VLSI Circuits Digest of Technical Papers, pp. 180-181.

* cited by examiner

US 9,484,383 B2

SOLID-STATE IMAGE PICKUP DEVICE, METHOD OF MANUFACTURING THEREOF, AND ELECTRONIC APPARATUS

CROSS REFERENCES TO RELATED APPLICATIONS

The present application is a Continuation of application Ser. No. 12/929,688, filed Feb. 9, 2011, and contains subject matter related to Japanese Patent Application JP 2010-068879 filed in the Japanese Patent Office on Mar. 24, 2010, the entire contents of which are incorporated herein by reference.

BACKGROUND OF THE INVENTION

1. Field of the Invention

The present invention relates to a solid-state image pickup device, a method of manufacturing thereof, and an electronic apparatus applied to a camera or the like provided with the solid-state image pickup device.

2. Description of the Related Art

As a solid-state image pickup device (image sensor), a CMOS (Complementary Metal Oxide Semiconductor) solid-state image pickup device is known. Since the CMOS solid-state image pickup device is driven with low voltage and low power consumption, the CMOS solid-state image pickup device is used for digital still cameras, digital video cameras, various mobile terminals such as mobile phones attached with a camera, or the like.

Each pixel in the CMOS solid-state image pickup device includes a photodiode as a photoelectric conversion portion receiving light and a plurality of pixel transistors outputting signals. In general, output signals are accumulated in an impurity diffusion layer, which is referred to as a floating diffusion (FD), in a silicon substrate and amplified by an amplifying transistor to be output.

Recently, as a technology of widening the dynamic range of the image sensor, disclosed is a technology where, besides the floating diffusion (FD), capacitance elements are formed in the substrate, and charges are also accumulated in the capacitance elements. This technology is disclosed in Japanese Journal of Applied Physics, vol. 47, No. 7, pp. 5390-5395, (2008) and Technical Digest of VLSI Circuit Technology, pp. 180-181, (2009), where a photodiode, a plurality of pixel transistors outputting signals, and a capacitance element for charge accumulation are included in each pixel.

FIG. 18 illustrates a layout of a pixel provided with a capacitance element disclosed in Technical Digest of VLSI Circuit Technology, pp. 180-181, (2009). In this CMOS solid-state image pickup device, a photodiode PD and a plurality of pixel transistors, that is, a transfer transistor Tr1, a reset transistor Tr2, an amplifying transistor Tr3, a column selecting transistor Tr4, and a capacitance selecting transistor Tr5 are formed in one pixel 111. T denotes a transfer gate electrode, FD denotes a floating diffusion, S denotes a capacitance selecting gate electrode, R denotes a reset gate electrode, SF denotes an amplifying gate electrode, and X denotes a column selecting gate electrode. In addition, a capacitance element 112 for charge accumulation is formed in the pixel 111. The one end of the capacitance element 112 is connected to a common source/drain region 113 of the reset transistor Tr2 and the capacitance selecting transistor Tr5, and the other end thereof is connected to a ground or a power supply VDD. A vertical signal line (not shown) is connected to a source/drain region 114 of the one side of the column selecting transistor Tr4.

In addition, on the other hand, a back side illuminated type CMOS solid-state image pickup device where wire lines are formed on a front surface side of a semiconductor substrate for implementation of high sensitivity in a CMOS solid-state image pickup device and image capturing is performed by using light which is incident from a rear surface side of the semiconductor substrate is disclosed in, for example, Japanese Patent No. 4123415, Japanese Unexamined Patent Application Publication Nos. 2003-31785 and 2006-245499. In the case of the back side illuminated type CMOS solid-state image pickup device, as illustrated in FIG. 4 of Japanese Patent No. 4123415, the wire line layer in the front surface of the semiconductor substrate may be disposed just above the photodiode without consideration of the light incident to the photodiode.

In addition, recently, a module where a CMOS solid-state image pickup device chip and a logic LSI chip are three-dimensionally laminated is disclosed in Japanese Unexamined Patent Application Publication Nos. 2002-44527 and 2006-49361, and the like. In this technology, the solid-state image pickup device chip is laminated on a chip, on which an AD converter or a memory is mounted, by using bump connection, so that miniaturization is implemented.

FIG. 19 illustrates a CMOS solid-state image pickup device 115 where a first semiconductor chip 116 including an image pickup area on which a plurality of pixels are arrayed in a two-dimensional array shape and a second semiconductor chip 117 on which logic circuits are formed are laminated. In the second semiconductor chip 117, a memory 118, an analog digital converter (hereinafter, referred to as an A/D converter), and the like are formed. In addition, in the second semiconductor chip 117, an area 119 where the first semiconductor chip 116 is to be laminated and other circuits are formed.

In addition, a CMOS solid-state image pickup device where light transmitting through a photoelectric conversion portion is reflected so as to be incident again to the photoelectric conversion portion is also disclosed in Japanese Unexamined Patent Application Publication No. 2008-147333 or the like.

SUMMARY OF THE INVENTION

In the solid-state image pickup device having a layout of the pixel added with the aforementioned capacitance element 112 illustrated in FIG. 18, the area occupied by the capacitance element 112 in one pixel is very large. In general, the size of the pixel constructed with a photodiode and a plurality of pixel transistors outputting signals has been miniaturized as the generation proceeds. On the other hand, in order to increase the sensitivity of light reception, it is necessary to increase the area of the photodiode. Under these circumstances, in the solid-state image pickup device having the pixels illustrated in FIG. 18, since the capacitance element 112 is necessarily disposed in one pixel, it is necessary to relatively decrease the area of the photodiode PD. Therefore, there is a problem in that the sensitivity of light reception is reduced. In addition, a process for newly forming the capacitance element 112 is necessary.

In addition, in a solid-state image pickup device where semiconductor chips 116 and 117 illustrated in FIG. 19 are laminated, there is a problem in that cross talk caused by noise from the second semiconductor chip 117 in which a logic circuit such as an AD converter is formed or noise caused by light incidence is generated. For example, in the second semiconductor chip 117 of the logic circuit, light emission caused by hot carriers generated at transistors is incident to the photodiode of the first semiconductor chip 116 of the solid-state image pickup device, so that noise is generated.

It is desirable to provide a solid-state image pickup device capable of improving the area efficiency of a photoelectric conversion portion in a back side illuminated type and reducing disturbance noise and a method of manufacturing the solid-state image pickup device.

It is desirable to provide an electronic apparatus adapted to a camera or the like having the solid-state image pickup device.

According to an embodiment of the invention, there is provided a solid-state image pickup device including: a plurality of pixels, each of which includes a photoelectric conversion portion and a pixel transistor formed in a front surface side of a substrate, wherein a rear surface side of the substrate is set as a light receiving plane of the photoelectric conversion portion; and an element, which becomes a passive element or an active element, which is disposed in the front surface side of the substrate so as to be superimposed on the photoelectric conversion portion.

The solid-state image pickup device according to the embodiment of the invention is configured as a back side illuminated type. In addition, since the passive element or the active element which is a portion of the components of the solid-state image pickup device is disposed in the front surface side of the substrate so as to be superimposed on the photoelectric conversion portion, so that it is possible to increase the area of the photoelectric conversion portion. In the configuration where the first semiconductor chip having an image pickup area and a second semiconductor chip in which a logic circuit is formed are laminated, cross talk caused by noise from the second semiconductor chip or disturbance noise such as noise caused by light incidence is reduced.

According to another embodiment of the invention, there is provided a method of manufacturing a solid-state image pickup device, including the step of forming a plurality of pixels in a semiconductor substrate, each of which includes a photoelectric conversion portion and a pixel transistor formed in a front surface side of the substrate, wherein a rear surface side of the substrate is set as a light receiving plane of the photoelectric conversion portion. In addition, the method may further include the step of forming an element, which becomes a passive element or an active element, which is disposed in the front surface side of the substrate so as to be superimposed on the photoelectric conversion portion.

In the method of manufacturing a solid-state image pickup device according to the embodiment of the invention, since the rear surface side of the substrate is used as a light receiving plane and the step of forming the passive element or the active element disposed in the front surface side of the substrate so as to be superimposed on the photoelectric conversion portion is included, it is possible to increase the area of the photoelectric conversion portion. In addition, in the configuration where the first and second semiconductor chips are laminated, it is possible to form the first semiconductor chip capable of shielding disturbance noise from the second semiconductor chip.

According to still another embodiment of the invention, there is provided an electronic apparatus including: a solid-state image pickup device; an optical system which guides incident light to a photodiode of the solid-state image pickup device; and a signal processing circuit which performs a process on an output signal of the solid-state image pickup device. The solid-state image pickup device includes a plurality of pixels, each of which includes a photoelectric conversion portion and a pixel transistor formed in a front surface side of a substrate, wherein a rear surface side of the substrate is set as a light receiving plane of the photoelectric conversion portion; and a passive element or an active element which is disposed in the front surface side of the substrate so as to be superimposed on the photoelectric conversion portion.

In the electronic apparatus according to the invention, since the aforementioned solid-state image pickup device according to the invention is provided, it is possible to increase the area of the photoelectric conversion portion in the solid-state image pickup device, and in the case where the first and second semiconductor chips are configured to be laminated, it is possible to reduce disturbance noise from the second semiconductor chip.

In the solid-state image pickup device according to the invention, it is possible to improve the area efficiency of the photoelectric conversion portion, so that it is possible to provide a back side illuminated type solid-state image pickup device where disturbance noise is reduced.

In the method of manufacturing a solid-state image pickup device according to the invention, it is possible to improve the area efficiency of the photoelectric conversion portion, so that it is possible to manufacture a back side illuminated type solid-state image pickup device where disturbance noise is reduced.

In the electronic apparatus according to the invention, it is possible to improve the area efficiency of the photoelectric conversion portion in the solid-state image pickup device, so that it is possible to reduce disturbance noise. Accordingly, it is possible to provide a high quality electronic apparatus such as a camera.

DESCRIPTION OF THE PREFERRED EMBODIMENTS

Hereinafter, embodiments for implementing the invention (hereinafter, referred to as embodiments) will be described. In addition, the description is made in the following order.

1. Example of Schematic Configuration of MOS Solid-State Image Pickup Device

2. First Embodiment (Example of Configuration of Solid-State Image Pickup Device)

3. Second Embodiment (Example of Configuration of Solid-State Image Pickup Device)

4. Third Embodiment (Example of Configuration of Solid-State Image Pickup Device)

5. Fourth Embodiment (Example of Configuration of Solid-State Image Pickup Device)

6. Fifth Embodiment (Example of Configuration of Solid-State Image Pickup Device)

7. Sixth Embodiment (Example of Configuration of Solid-State Image Pickup Device)

8. Seventh Embodiment (Example of Configuration of Solid-State Image Pickup Device)

9. Eighth Embodiment (Example of Configuration of Solid-State Image Pickup Device)

10. Ninth Embodiment (Example of Method of Manufacturing Solid-State Image Pickup Device)

11. Tenth Embodiment (Example of Method of Manufacturing Solid-State Image Pickup Device)

12. Eleventh Embodiment (Example of Method of Manufacturing Solid-State Image Pickup Device)

13. Twelfth Embodiment (Example of Configuration of electronic apparatus)

1. Example of Schematic Configuration of CMOS Solid-State Image Pickup Device

Figure 1:
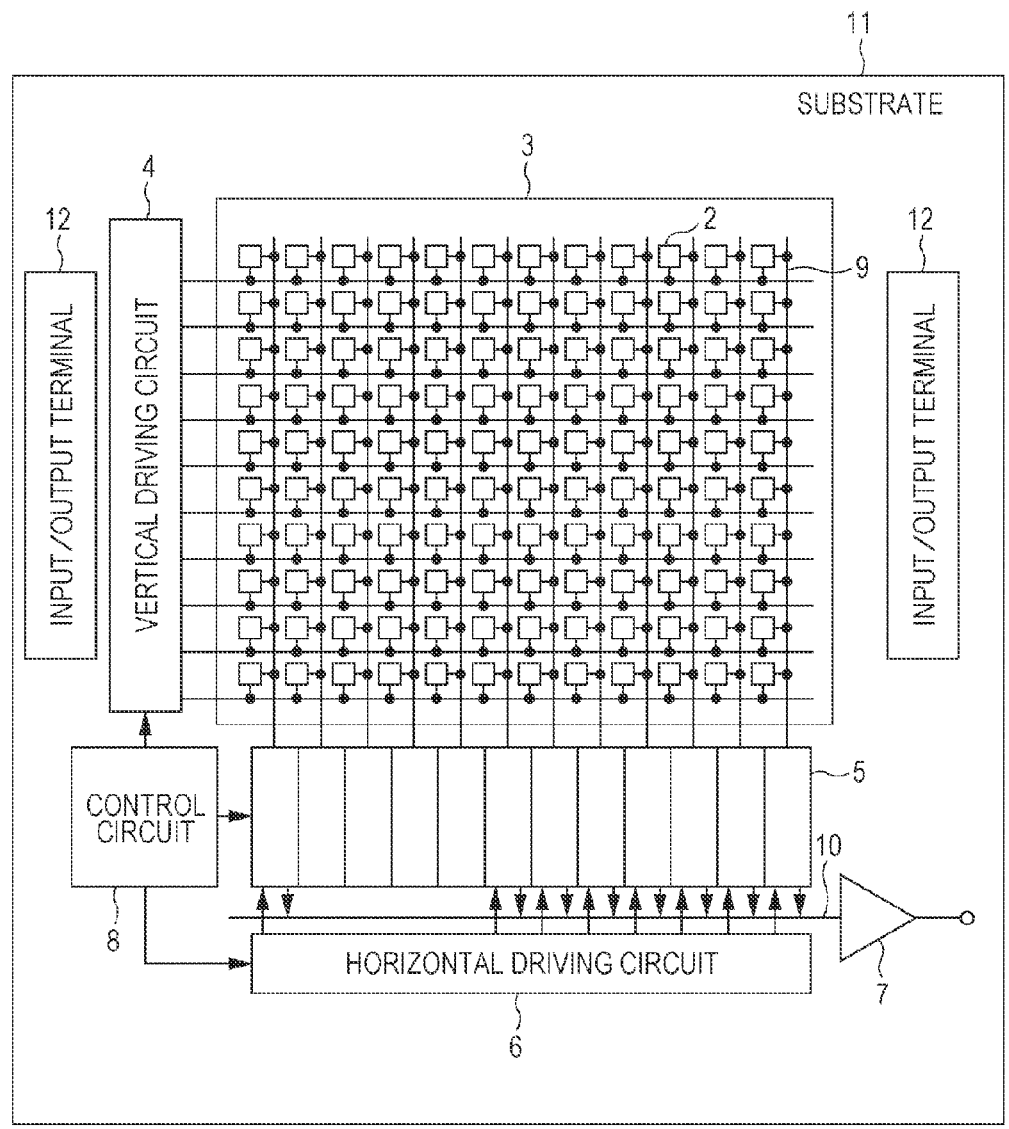
FIG. 1 is a schematic configuration diagram illustrating an example of a solid-state image pickup device applied to embodiments of the invention.

FIG. 1 illustrates a schematic configuration of an example of an MOS solid-state image pickup device applied to embodiments of the invention. As illustrated in FIG. 1, the solid-state image pickup device 1 of the example is configured to include a pixel area (a so-called image pickup area) 3 where a plurality of pixels 2 including photoelectric conversion portions are arrayed regularly in a two-dimensional array shape in a semiconductor substrate 11, for example, a silicon substrate and a peripheral circuit portion. As the pixel 2, a unit pixel constructed with one photoelectric conversion portion and a plurality of the pixel transistors may be used. In addition, as the pixel 2, a so-called pixel shared structure where a plurality of the photoelectric conversion portions shares other pixel transistors except for the transfer transistor may be used. A plurality of the pixel transistors may be constructed with four transistors including a transfer transistor, a reset transistor, an amplifying transistor, and a selecting transistor or three transistors excluding the selecting transistor.

The peripheral circuit portion is configured to include so-called logic circuits such as a vertical driving circuit 4, a column signal processing circuit 5, a horizontal driving circuit 6, an output circuit 7, and a control circuit 8.

The control circuit 8 receives an input clock and a data commanding an operation mode or the like and outputs a data of internal information or the like of the solid-state image pickup device. In other words, the control circuit 8 generates a clock signal or a control signal, which becomes a reference of operations of the vertical driving circuit 4, the column signal processing circuit 5, the horizontal driving circuit 6, and the like, according to a vertical synchronization signal, a horizontal synchronization signal, and a master clock. In addition, the control circuit 8 inputs these signals to the vertical driving circuit 4, the column signal processing circuit 5, the horizontal driving circuit 6, and the like.

The vertical driving circuit 4 is constructed with, for example, a shift register to select a pixel driving wire line and to supply a pulse for driving a pixel with the selected pixel driving wire line so as to drive pixels in units of a row. In other words, the vertical driving circuit 4 selectively drives the pixels 2 in the pixel area 3 sequentially in units of a row in the vertical direction. In addition, a pixel signal according to signal charges generated according to a received light amount, for example, in a photodiode which becomes the photoelectric conversion element of each pixel 2 is supplied to the column signal processing circuit 5 through a vertical signal line 9.

The column signal processing circuit 5 is disposed, for example, for each column of the pixels 2 to perform a signal process such as a noise removing process in units of a column of pixels on signals output from one row worth of the pixels 2. In other words, the column signal processing circuit 5 performs a signal process such as CDS for removing fixed pattern noise unique to the pixels 2, signal amplification, or AD conversion. A horizontal select switch (not shown) is disposed to be connected to the output terminal of the column signal processing circuit 5 between a horizontal signal line 10 and the output terminal.

The horizontal driving circuit 6 is constructed with, for example, a shift register to sequentially output horizontal scan pulses so as to sequentially select each of the column signal processing circuits 5 and to output a pixel signal from each of the column signal processing circuits 5 to the horizontal signal line 10.

The output circuit 7 performs a signal process on the signals sequentially supplied from each of the column signal processing circuits 5 through the horizontal signal line 10 and outputs the processed signals. For example, there may be a case where only buffering may be performed or a case where various digital signal processes such as black level adjustment or column variation correction may be performed. An input/output terminal 12 exchanges signals with an external portion.

2. First Embodiment

Example of Configuration of Solid-State Image Pickup Device

Figure 2:
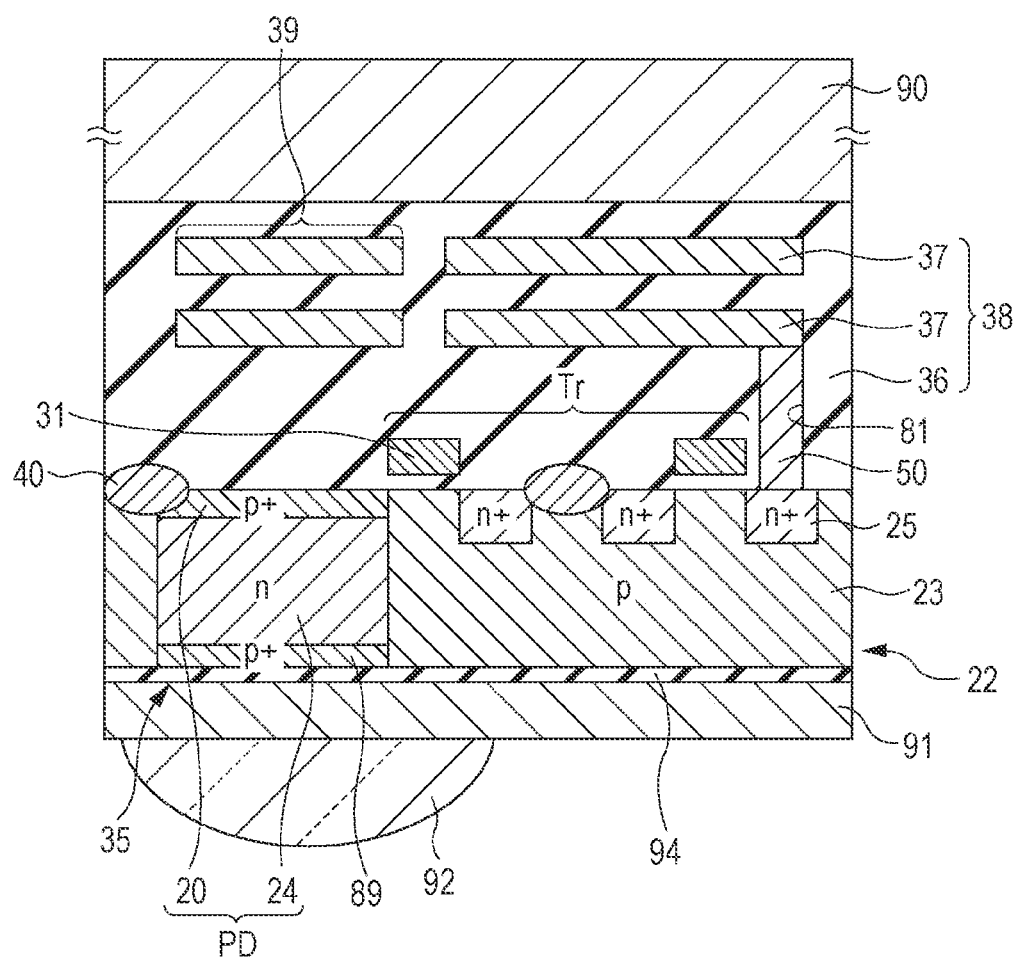
FIG. 2 is a schematic cross-sectional diagram illustrating main components of a solid-state image pickup device according to a first embodiment of the invention.
Figure 3:
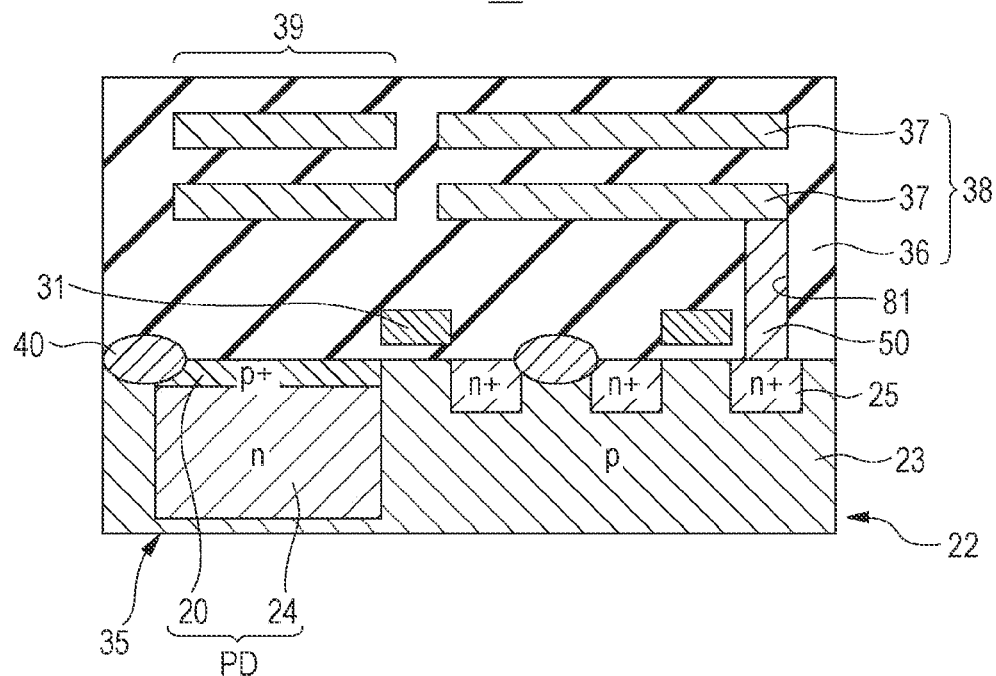
FIG. 3 is a schematic cross-sectional diagram illustrating main components according to the first embodiment of the invention.
Figure 4:
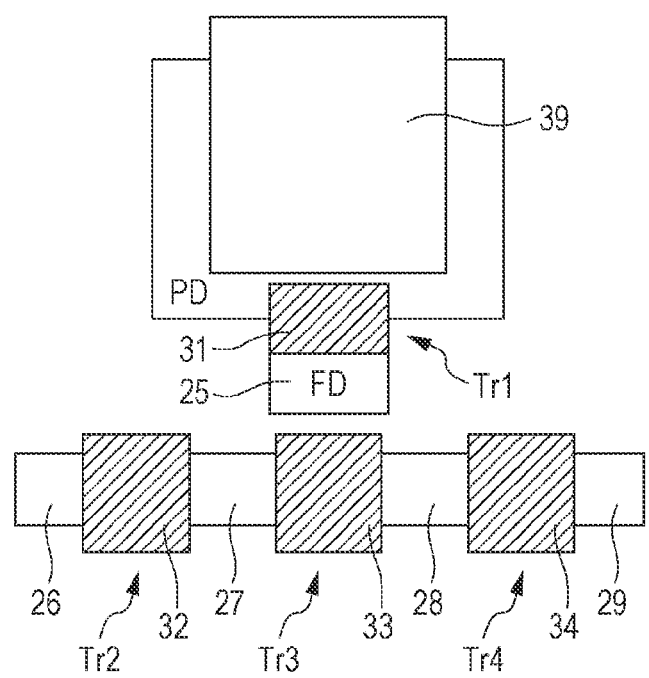
FIG. 4 is a schematic plan diagram illustrating main components according to the first embodiment of the invention.

FIGS. 2 to 4 illustrate a solid-state image pickup device according to a first embodiment of the invention, that is, a back side illuminated type CMOS solid-state image pickup device. FIG. 2 illustrates a schematic configuration of an area corresponding to a unit pixel of an image pickup area where a plurality of the pixels is arrayed in a two-dimensional array shape. FIG. 3 illustrates a schematic cross sectional structure of main components of FIG. 2. FIG. 4 illustrates a schematic plan diagram, that is, a schematic plan layout of FIG. 3.

In the solid-state image pickup device 21 according to the first embodiment, a second conductivity type semiconductor well area 23 is formed in a first conductivity type silicon semiconductor substrate 22, and a photodiode PD which becomes the photoelectric conversion portion is formed in the semiconductor well area 23 in the depth direction from a front surface of the substrate. In this embodiment, the first conductivity type is set to be the n type, and the second conductivity type is set to be the p type. The photodiode PD is configured to include an n-type semiconductor area 24 and a p-type semiconductor area 20 which also suppresses dark currents in the front surface side of the substrate. A plurality of the pixel transistors Tr constituting read circuits for reading signal charges of the photodiode PD are formed in the front surface side of the p-type semiconductor well area 23. In this embodiment, a plurality of the pixel transistors Tr are constructed with four transistors of the transfer transistor Tr1, the reset transistor Tr2, the amplifying transistor Tr3, and the selecting transistor Tr4.

The transfer transistor Tr1 is formed to include a photodiode PD, an n-type semiconductor area 25, which becomes a floating diffusion portion FD, and a transfer gate electrode 31. The reset transistor Tr2 is formed to include a pair of n-type source/drain regions 26 and 27 and a reset gate electrode 32. The amplifying transistor Tr3 is formed to include a pair of n-type source/drain regions 27 and 28 and an amplifying gate electrode 33. The selecting transistor Tr4 is formed to include a pair of n-type source/drain regions 28 and 29 and a selecting gate electrode 34.

Although not shown, the floating diffusion portion FD is connected through a later-described wire line to the amplifying gate electrode 33 and the n-type source/drain region 26 which becomes the actual source region of the reset transistor Tr2. The n-type source/drain region 27 which becomes the actual drain region of each of the reset transistor Tr2 and the amplifying transistor Tr3 is connected to the power supply VDD. The n-type source/drain region 29 which becomes the actual source region of the selecting transistor Tr4 is connected to the vertical signal line. Between adjacent pixels or within the unit pixel, an element isolation region 40 is provided.

The photodiode PD and a plurality of the pixel transistors Tr1 to Tr4 are formed in the semiconductor substrate 22 by using the so-called front-end process.

On the other hand, a multi-layered wire line layer 38, in which wire lines 37 of a plurality of layers are formed through interlayer insulating films 36, is formed on the front surface of the semiconductor substrate 22. In this embodiment, a two-layered wire line 37 is formed. The multi-layered wire line layer 38 is formed by using the so-called back-end process. Reference numeral 50 denotes a connection conductor which connects a necessary pixel transistor to a necessary wire line.

In addition, in this embodiment, an element 39 which becomes a passive element or an active element superimposed on the photodiode PD is formed in the front surface side of the substrate. The passive element is simultaneously formed by using the interlayer insulating films 36 and the wire lines 37 of the multi-layered wire line layer 38. As a passive element, there is a capacitance element, a resistance element, an inductance element, or the like in a pixel or a peripheral circuit side. The active element is formed by using the wire line 37, the interlayer insulating film 36, or the like which is formed by using the back-end process. As an active element, there is a pixel transistor or the like constituting a pixel. The transistor may be formed, for example, as a thin-film transistor.

After the back-end process is finished, a support substrate 90, for example, a silicon substrate or the like is adhered on the front surface side of the semiconductor substrate 22, and the semiconductor substrate 22 is thinned by polishing the rear surface thereof. The rear surface of the substrate which is thinned down to the vicinity of the photodiode PD is formed as a light receiving plane 35. A p-type semiconductor area 89 for suppressing dark currents is formed in an interface which faces the light receiving plane 35 of the photodiode PD. A color filter 91 and an on-chip lens 92 are formed through an insulating film 94 in the side of the light receiving plane 35, so that the back side illuminated type solid-state image pickup device 21 according to the embodiment is completed. In addition, the p-type semiconductor area 89 and the on-chip lens 92 may be omitted in the configuration.

According to the solid-state image pickup device 21 of the first embodiment, since the element 39 such as a passive element or an active element is disposed so as to be superimposed just on the photodiode PD by using a back-end process, it is possible to improve the area efficiency of the photodiode PD of the pixel. Since the high sensitivity is obtained due to the improvement of the area efficiency of the photodiode PD, it is possible to miniaturize and highly integrate the pixels, so that it is possible to provide a high quality solid-state image pickup device.

3. Second Embodiment

Example of Configuration of Solid-State Image Pickup Device

Figure 5:
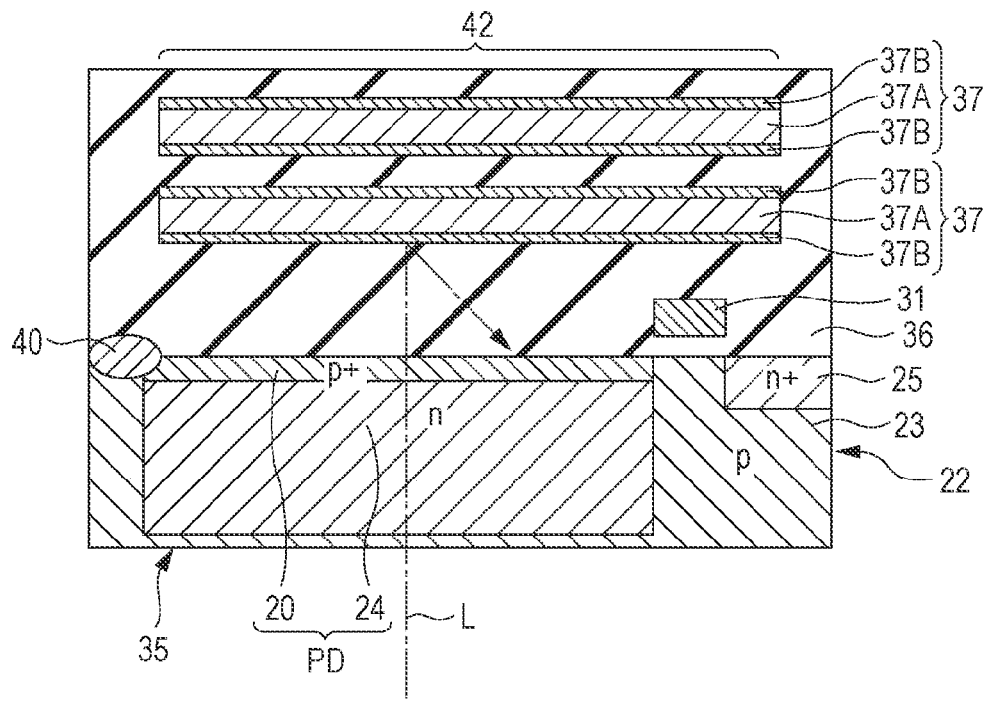
FIG. 5 is a schematic cross-sectional diagram illustrating main components of a solid-state image pickup device according to a second embodiment of the invention.
Figure 6:
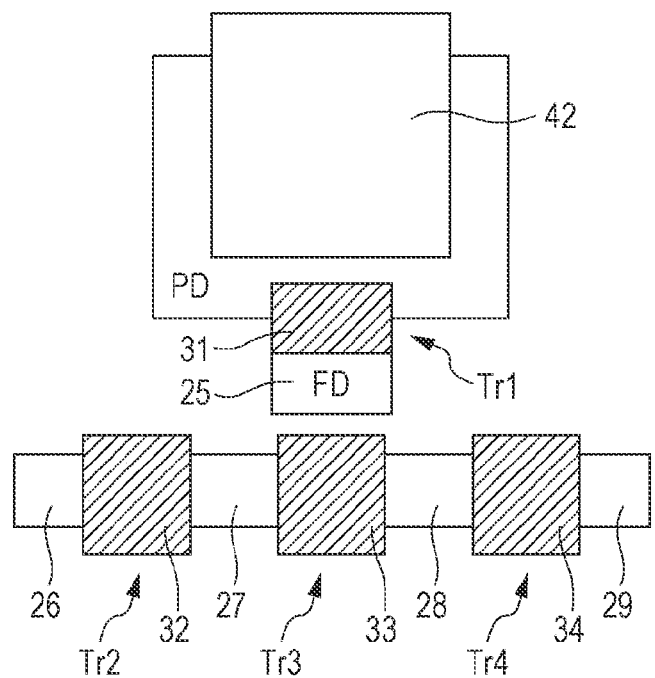
FIG. 6 is a schematic plan diagram illustrating main components of the solid-state image pickup device according to the second embodiment of the invention.

FIGS. 4 and 5 illustrate a solid-state image pickup device according to a second embodiment of the invention, that is, a back side illuminated type CMOS solid-state image pickup device. Similarly to FIG. 3 described above, FIG. 5 illustrates a schematic cross sectional structure of main components in an area corresponding to a unit pixel of an image pickup area where a plurality of the pixels are arrayed in a two-dimensional array shape. FIG. 6 illustrates a schematic plan diagram, that is, a schematic plan layout thereof.

Figure 7:
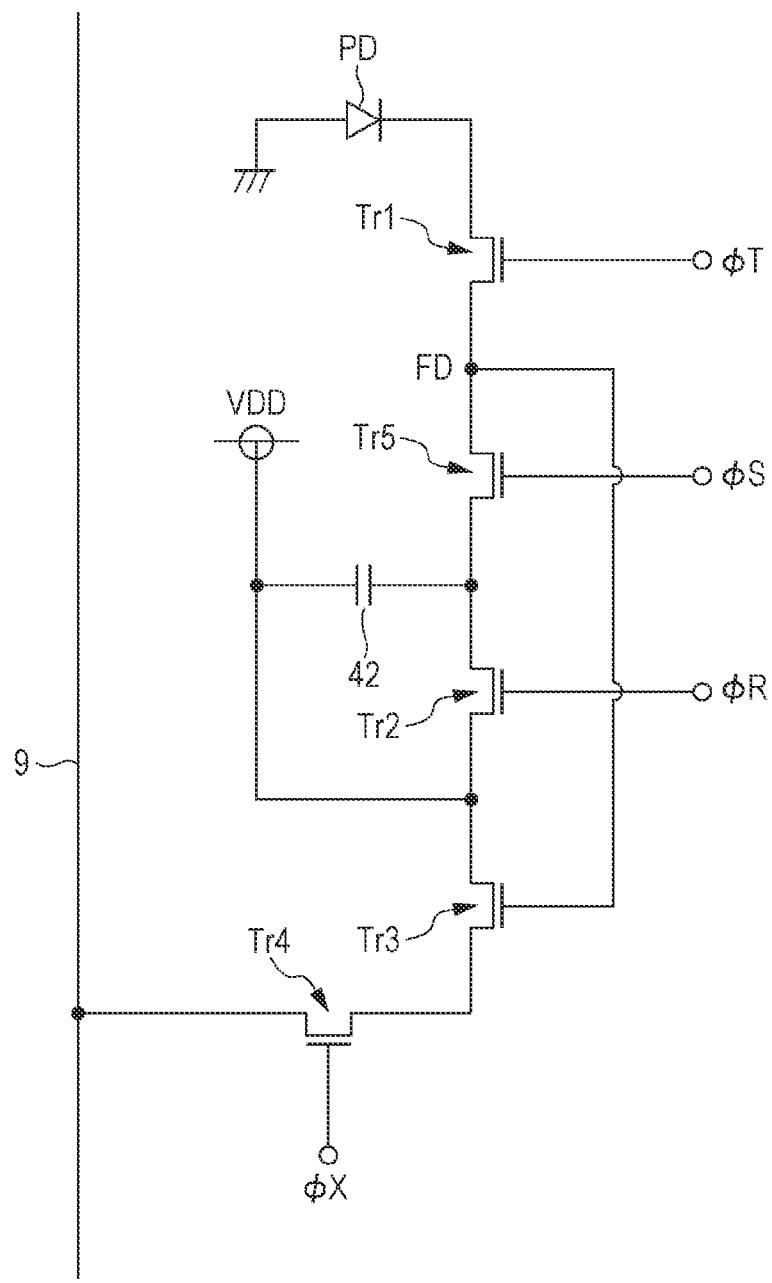
FIG. 7 is an equivalent circuit diagram of a unit pixel according to the second embodiment.

First, an example of an equivalent circuit of a unit pixel according to the embodiment is described with reference to FIG. 7. The unit pixel 41 according to the embodiment is constructed with a photodiode PD which becomes the photoelectric conversion portion and five pixel transistors. The five pixel transistors include a transfer transistor Tr1, a reset transistor Tr2, an amplifying transistor Tr3, a column selecting transistor Tr4, and a capacitance selecting transistor Tr5. Herein, as the pixel transistors Tr1 to Tr5, for example, n-channel MOS transistors may be used.

The photodiode PD is connected to the transfer transistor Tr1. The transfer transistor Tr1 is connected to the capacitance selecting transistor Tr5 through the floating diffusion portion FD. Signal charges (herein, electrons), which are generated by photoelectric conversion in the photodiode PD and stored therein, are transferred to the floating diffusion portion FD by applying a transfer pulse ϕT to the gate of the transfer transistor Tr1.

The capacitance selecting transistor Tr5 is connected to a series circuit constructed with the reset transistor Tr2, the amplifying transistor Tr3, and the column selecting transistor Tr4. The floating diffusion portion FD is connected to the gate of the amplifying transistor Tr3. The power supply VDD is connected to the source of the reset transistor Tr2 and the drain of the amplifying transistor Tr3, that is, the common source/drain region. The source of the selecting transistor is connected to the vertical signal line 9. In addition, a capacitance element 42 for charge storage is connected between a central connection point of the capacitance selecting transistor Tr5 and the reset transistor Tr2 and the power supply VDD. A capacitance selecting pulse ϕS is applied to the capacitance selecting gate of the capacitance selecting transistor Tr5; a reset pulse ϕR is applied to the reset gate of the reset transistor Tr2; and a column selecting pulse ϕX is applied to the column selecting gate of the column selecting transistor Tr4.

Herein, the source of the capacitance selecting transistor Tr5 (the drain of the transfer transistor Tr1) is configured as a floating diffusion portion FD. Before the signal charges are transferred from the photodiode PD to the floating diffusion portion FD, the reset pulse ϕR and the capacitance selecting pulse ϕS are applied to the reset gate and the capacitance selecting gate, respectively. Therefore, the potential of the floating diffusion portion FD and the capacitance of the capacitance element 42 for charge storage are reset. By applying the column selecting pulse ϕX to the gate of the column selecting transistor Tr4, the column selecting transistor Tr4 is in the on state, so that the pixel is selected.

When strong light is received, the charges overflown from the photodiode PD exceeds the potential barrier under the channel of the transfer transistor Tr1 and the capacitance selecting transistor Tr5 to be stored in the floating diffusion portion FD and the capacitance element 42. At this time, the photoelectrons that are not saturated are stored in the photodiode PD. After the storage is finished, the capacitance selecting transistor Tr5 is turned off, so that the signal charges stored in the floating diffusion portion FD and the capacitance element 42 are divided. At this time, the signal charges of the floating diffusion portion FD, which include noise caused by a variation of the transistor, are read. Next, the transfer transistor Tr1 is turned on, so that the signal charges stored in the photodiode PD are transferred to the floating diffusion portion FD. After the transfer is finished, the transfer transistor Tr1 is turned off, so that the signal of the floating diffusion portion FD is read. This signal is a sum of the aforementioned noise and signal. Next, the transfer transistor Tr1 and the capacitance selecting transistor Tr5 are turned on, so that all charges are collected in the floating diffusion portion FD and the capacitance element 42, and the signal thereof is read. In this manner, the signal charges which are read several times are converted into a charge voltage by the amplifying transistor Tr3, and the charge voltage is output through the column selecting transistor Tr4 to the vertical signal line 9 as a pixel signal.

In addition, the equivalent circuit of the unit pixel is not limited to the aforementioned example, but other equivalent circuits may be employed.

Similarly to the aforementioned embodiment, in the solid-state image pickup device 44 according to the second embodiment, a second conductivity type semiconductor well area 23 is formed in a first conductivity type silicon semiconductor substrate 22, and a photodiode PD which becomes the photoelectric conversion portion is formed in the semiconductor well area 23 in the depth direction from the front surface of the substrate. In this embodiment, the first conductivity type is set to be the n type, and the second conductivity type is set to be the p type. The photodiode PD is configured to include an n-type semiconductor area 24 and a p-type semiconductor area 25 which also suppresses dark currents in the front surface side of the substrate. A plurality of the pixel transistors are formed in the front surface side of the p-type semiconductor well area 23. In this embodiment, as illustrated in the equivalent circuit of FIG. 6, a plurality of the pixel transistors are constructed with four transistors including a transfer transistor Tr1, a reset transistor Tr2, an amplifying transistor Tr3, and a selecting transistor Tr4.

The photodiode PD and a plurality of the pixel transistors Tr1 to Tr4 may be formed in the semiconductor substrate 22 by using the so-called front-end process.

On the other hand, a multi-layered wire line layer 38, in which wire lines 37 of a plurality of layers are formed through interlayer insulating films 36, is formed on the front surface of the semiconductor substrate 22. In this example, a two-layered wire line 37 is formed. The multi-layered wire line layer 38 is formed by using the so-called back-end process.

In addition, in the embodiment, a capacitance element 42 which becomes a passive element superimposed on the photodiode PD is formed in the front surface side of the substrate. The capacitance element 42 is a capacitance element for charge storage, which is used for storing charges leaking from the photodiode PD. The capacitance element 42 is simultaneously formed by using the interlayer insulating films 36 and the wire lines 37 of the multi-layered wire line layer 38. The wire line 37 may be formed as a metal wire line of Cu, Al, W, or the like. In this example, the wire lines 37 are formed with a Cu wire line 37A and a barrier metal 37B which is formed on the upper and lower surfaces of the Cu wire line 37A. The barrier metal 37B is formed by using a metal which prevents diffusion of Cu and does not pass light. The capacitance element 42 is formed by using the wire line 37 and the interlayer insulating film 36 of the first layer and the wire line 37 of the second layer. In the case where the wire lines 37 includes three or more layers, it is preferable that the capacitance element 42 is formed by using the wire lines 37 of the two layers near to the photodiode PD and the interlayer insulating film 36 therebetween because the charges leaking from the photodiode PD are easily transferred to the capacitance element 42.

The interlayer insulating film 36 may be formed by using a silicon oxide film ($SiO_2$), a silicon oxide nitride film (SiON), or the like, or a so-called high dielectric film including hafnium, tantalum, or the like. In particular, the interlayer insulating film 36 of a portion where the capacitance element 42 is to be formed may be formed by using a high dielectric film, and other interlayer insulating films 36 may be formed by using a silicon oxide film, a silicon oxide nitride film, or the like having a low dielectric constant. The high dielectric film is used for the capacitance element 42, so that it is possible to increase a capacitance per unit area.

After the back-end process is finished, although not shown, a support substrate such as a silicon substrate is adhered on the interlayer insulating film 36, and the semiconductor substrate 22 is thinned by polishing the rear surface thereof. The rear surface of the substrate which is thinned down to the vicinity of the photodiode PD is formed as a light receiving plane 35. A p-type semiconductor area 89 for suppressing dark currents is formed in an interface which faces the light receiving plane 35 of the photodiode PD. A color filter and an on-chip lens are formed in the side of the light receiving plane 35, so that the back side illuminated type solid-state image pickup device according to the embodiment is completed.

Since other configurations are the same as those described in the first embodiment, in FIGS. 5 and 6, the components corresponding to FIGS. 3 and 4 are denoted by the same reference numerals, and the description thereof is omitted.

In the solid-state image pickup device 44 according to the second embodiment, the capacitance element 42 for charge storage constituting the unit pixel 41 is disposed just above the photodiode PD by using the multi-layered wire line layer 38, so that it is possible to improve the area efficiency of the photodiode PD in the pixel. Since the capacitance element 42 is formed on the photodiode PD by using a metal wire line, as illustrated with a broken line in FIG. 5, the light L which is irradiated from the rear surface and transmitted through the photodiode PD is reflected on the electrode (the wire line 37 of a metal) of the capacitance element 42 to be incident again to the photodiode PD. Therefore, it is possible to improve the light usage efficiency. Due to the improvement of the area efficiency of the photodiode PD, the high sensitivity is obtained, so that it is possible to miniaturize and highly integrate the pixels. Accordingly, it is possible to provide a high quality solid-state image pickup device.

According to the embodiment, without increasing the layout area of the capacitance element 42, it is possible to freely set a capacitance value with the size of the wire line 37 which becomes an electrode and the thickness of the interlayer insulating film 36. When the dielectric film of the capacitance element 42 as the interlayer insulating film 36 is formed by using a high dielectric film, it is possible to increase a capacitance value per valley area. Since the capacitance element 42 for charge storage is included, it is possible to set a saturated signal amount to a large value, so that it is possible to provide a solid-state image pickup device having a widened dynamic range.

In addition, the wire lines 37 of the two layers constituting the capacitance element 42 may be configured by combining two metal wire lines, by combining a metal wire line as the one wire line and a polysilicon wire line as the other wire line, or by combining two polysilicon wire lines.

4. Third Embodiment

Example of Configuration of Solid-State Image Pickup Device

Figure 8:
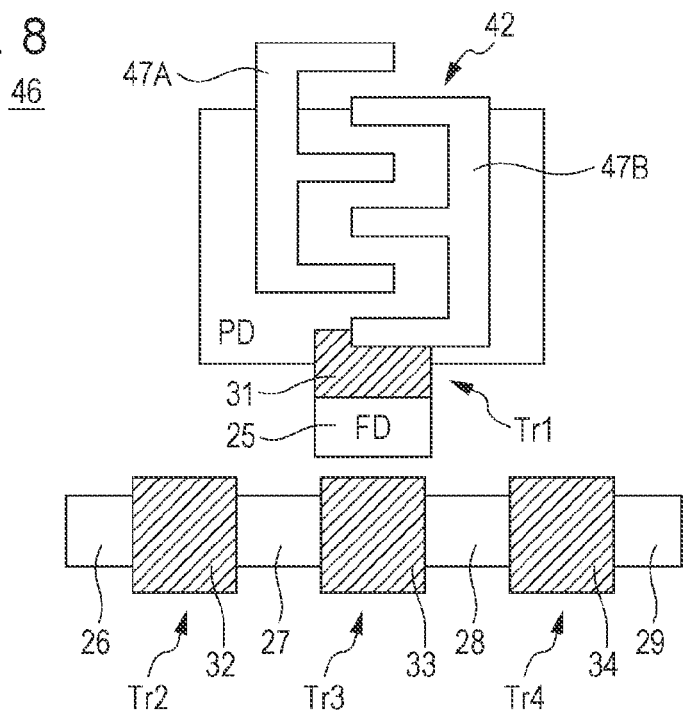
FIG. 8 is a schematic plan diagram illustrating main components of a solid-state image pickup device according to a third embodiment of the invention.

FIG. 8 illustrates a solid-state image pickup device according to a third embodiment of the invention, that is, a back side illuminated type CMOS solid-state image pickup device. FIG. 8 illustrates a schematic plan diagram, that is, a schematic plan layout of an area corresponding to a unit pixel of an image pickup area where a plurality of the pixels are arrayed in a two-dimensional array shape.

The solid-state image pickup device 46 according to the third embodiment is configured by disposing a capacitance element 42 having so-called comb-teeth electrodes on the photodiode PD so as to be superimposed thereon. In other words, a pair of facing comb-teeth electrodes 47A and 47B of the capacitance element 42 are formed by using the same layer, for example, the wire line 37 of the first layer in the multi-layered wire line layer 38, and the capacitance element 42 is configured with the comb-teeth electrodes 47A and 47B and the interlayer insulating film 36 (not shown) therebetween. Since other configurations are the same as those described in the first embodiment, in FIG. 8, the components corresponding to FIG. 4 are denoted by the same reference numerals, and the description thereof is omitted.

In the solid-state image pickup device 46 according to the third embodiment, a comb-teeth type capacitance element 42 having comb-teeth shaped electrodes 47A and 47B which are formed by using the wire line 37 of the same layer is disposed just above the photodiode PD. Therefore, similarly as described in the second embodiment, since the high sensitivity is obtained due to the improvement of the area efficiency of the photodiode PD, it is possible to miniaturize and highly integrate the pixels, so that it is possible to provide a high quality solid-state image pickup device. In addition, since the capacitance element 42 for charge storage is included, it is possible to set a saturated signal amount to a large value, so that it is possible to provide a solid-state image pickup device having a widened dynamic range.

5. Fourth Embodiment

Example of Configuration of Solid-State Image Pickup Device

Figure 9:
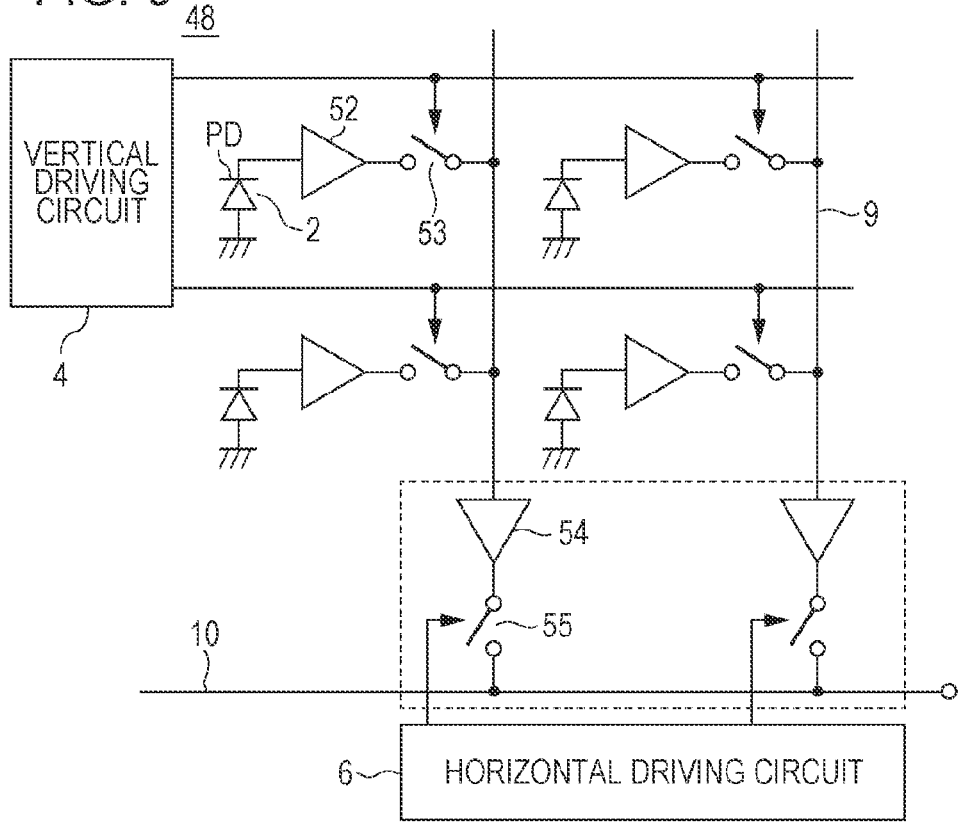
FIG. 9 is a circuit configuration diagram illustrating a solid-state image pickup device for explaining the solid-state image pickup device according to a fourth embodiment of the present invention.

FIG. 9 illustrates a solid-state image pickup device according to a fourth embodiment of the invention, that is, a back side illuminated type CMOS solid-state image pickup device. FIG. 9 illustrates a diagrammatic equivalent circuit of the solid-state image pickup device according to the embodiment. As illustrated in FIG. 9, the solid-state image pickup device 48 according to the fourth embodiment is implemented by arraying pixels 2, each of which includes a photodiode PD and a plurality of pixel transistors, in a two-dimensional array shape. Similarly to the aforementioned embodiment, a plurality of the pixel transistors are constructed with four transistors including a representatively illustrated amplifying transistor 52 including a transfer transistor and a reset transistor and a switch element 53 which becomes a selecting transistor. In this embodiment, the outputs of the pixels 2 arrayed in the two-dimensional array shape are read in units of a column, and the outputs as digital signals are output to the A/D converter 54. In addition, the pixels 2 are driven by a driving signal from the vertical driving circuit 4 at every horizontal line, and the pixel signals are output though the vertical signal line 9. The pixel signals from the A/D converter 54 are output through the horizontal signal line 10 when the switch element 55 is turned on by the signal from the horizontal driving circuit 6.

In addition, in the embodiment, the capacitance element included in the A/D converter 54 is formed as the capacitance element by using the wire line 37 and the interlayer insulating film 36 as illustrated in FIGS. 5 and 8 described above, and the capacitance element is configured to be disposed on the photodiode PD. Other configurations are the same as those of the solid-state image pickup device described above, and thus, the description thereof is omitted.

In the solid-state image pickup device 48 according to the fourth embodiment, since the capacitance element included in the A/D converter 54 is disposed on the photodiode PD, the area occupying the peripheral circuit is reduced, so that it is possible to improve the area efficiency of the photodiode PD. In addition, when the A/D converter is formed in another semiconductor chip, it is possible to implement the semiconductor chip having the solid-state image pickup device 48 with a smaller size. Therefore, it is possible to miniaturize and highly integrate the pixels, so that it is possible to provide a high quality solid-state image pickup device.

The fourth embodiment shows an example where the capacitance element included in the A/D converter is disposed just above the photodiode PD. Besides that, a configuration where a capacitance element included in, for example, a correlated double sampling circuit (CDS) constituting a signal processing circuit is disposed just above the photodiode PD may be used. The configuration may also give the same effect as that of the fourth embodiment.

Modified Example of Fourth Embodiment

In the solid-state image pickup device according to the modified example, although not shown, the A/D converter is provided to each pixel, the capacitance element of each A/D converter is disposed on the area of the corresponding A/D converter by using the interlayer insulating film 36 and the wire line 37. On the other hand, as illustrated in FIGS. 5 and 8, the capacitance element 42 for charge storage formed by using the interlayer insulating film 36 and the wire line 37 is disposed on each of the photodiodes PD. Other configurations are the same as those of the solid-state image pickup device described above, and thus, the description thereof is omitted.

In the solid-state image pickup device according to the modified example, since the capacitance element of the A/D converter is disposed on each area of the A/D converter for each pixel, it is possible to improve the area efficiency of the photodiode PD, so that it is possible to improve sensitivity characteristics. Therefore, it is possible to miniaturize and highly integrate the pixels, so that it is possible to provide a high quality solid-state image pickup device.

6. Fifth Embodiment

Example of Configuration of Solid-State Image Pickup Device

Although not shown, a solid-state image pickup device according to a fifth embodiment of the invention, that is, a back side illuminated type solid-state image pickup device, is configured by disposing a capacitance element for storing charges, which is necessary for a global shutter operation of the photodiodes PD of each pixels. In the solid-state image pickup device performing the global shutter operation, an element which simultaneously discharges the charges stored in the photodiodes PD of all the pixels during the charge storage period and stores the charges stored in the remaining charge storage period is necessary. In the embodiment, the capacitance element illustrated in FIGS. 5 and 8 is configured as the element for charge storage. The capacitance element is connected between the photodiode PD and the floating diffusion portion FD to operate as a memory. Other configurations are the same as those of the solid-state image pickup device described above, and thus, the description thereof is omitted.

In the solid-state image pickup device according to the fifth embodiment, it is possible to enable a global shutter operation, and it is possible to improve the area efficiency of the photodiode PD. Therefore, it is possible to miniaturize and highly integrate the pixels, so that it is possible to provide a high quality solid-state image pickup device.

7. Sixth Embodiment

Example of Configuration of Solid-State Image Pickup Device

Figure 10:
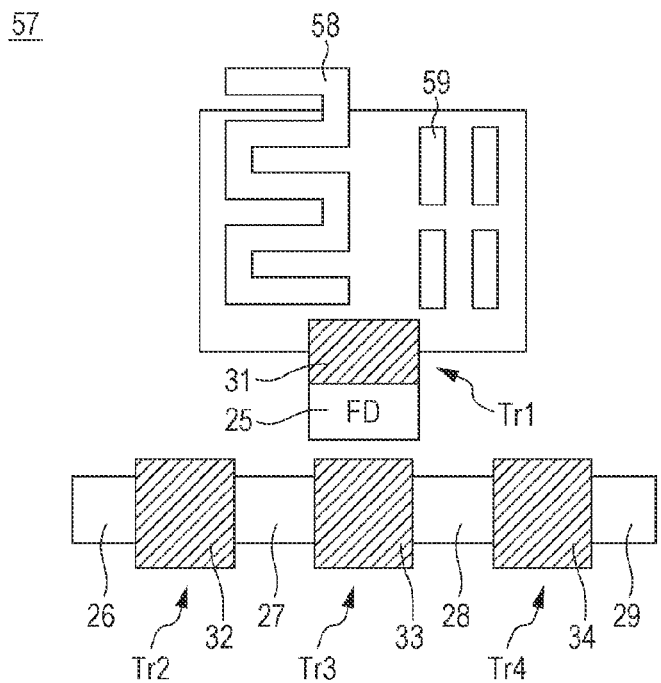
FIG. 10 is a schematic plan diagram illustrating main components of the solid-state image pickup device according to a sixth embodiment of the invention.

FIG. 10 illustrates a solid-state image pickup device according to a sixth embodiment of the invention, that is, a back side illuminated type CMOS solid-state image pickup device. FIG. 10 illustrates a schematic plan diagram, that is, a schematic plan layout of main components in an area corresponding to a unit pixel of an image pickup area where a plurality of the pixels are arrayed in a two-dimensional array shape.

The solid-state image pickup device 57 according to the sixth embodiment is configured by disposing an inductance element 58 and/or a resistance element 59 which become passive elements on the photodiode PD so as to be superimposed thereon. The inductance element 58 and the resistance element 59 are formed by the aforementioned wire line 37, for example, the wire line 37 in the same layer. The inductance element 58 and the resistance element 59 may be used as a circuit which reads, for example, an output of the photodiode PD. The inductance element 58 and the resistance element 59 may be an inductance element or a resistance element in a peripheral circuit or a pixel. Since other configurations are the same as those described in the first embodiment, in FIG. 10, the components corresponding to FIG. 4 are denoted by the same reference numerals, and the description thereof is omitted. In addition, in order to improve inductance characteristics, a laminated inductance element formed by surrounding a copper wire line with a magnetic material such as NiFe may be used as the aforementioned inductance element 58. Since various elements which become passive elements are formed by the wire line 37, a magnetic layer $AFe_xO_y$ (A is Mn, Co, Ni, Cu, Zn, Ba, Sr, Pb, Y, or the like) which is not generally used in a semiconductor device may also be used for the inductance element 58.

In the solid-state image pickup device 57 according to the sixth embodiment, since the inductance element 58 and/or the resistance element 59 which are used for a circuit of reading an output of the photodiode PD are disposed just above the photodiode PD, it is possible to improve the area efficiency of the photodiode PD, so that it is possible to improve sensitivity characteristics. Therefore, it is possible to miniaturize and highly integrate the pixels, so that it is possible to provide a high quality solid-state image pickup device.

8. Seventh Embodiment

Example of Configuration of Solid-State Image Pickup Device

Figure 11:
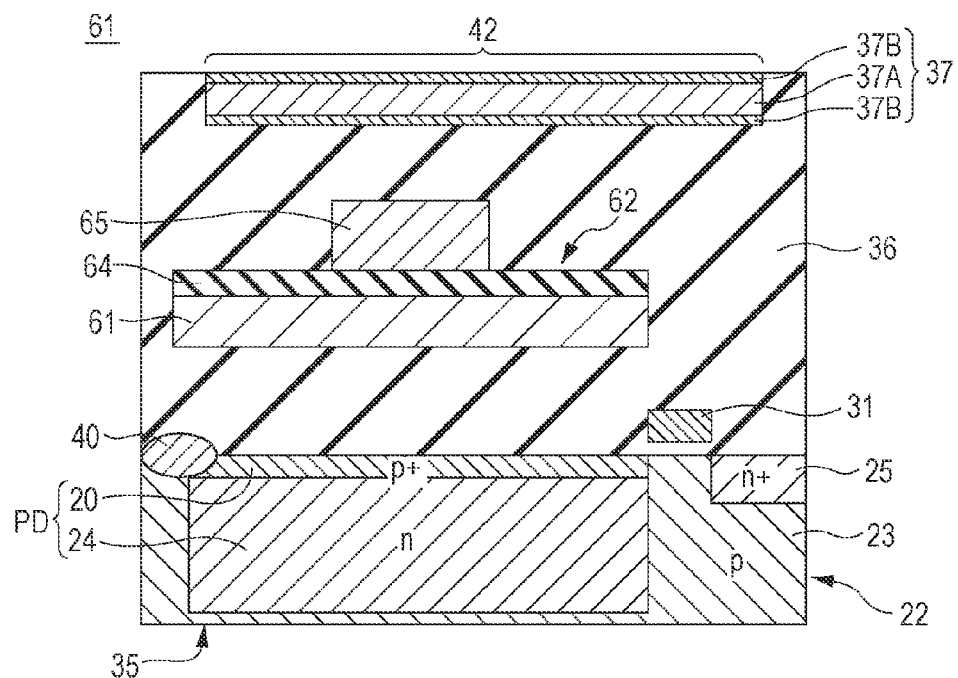
FIG. 11 is a schematic cross-sectional diagram illustrating main components of the solid-state image pickup device according to a seventh embodiment of the invention.

FIG. 11 illustrates a solid-state image pickup device, that is, a back side illuminated type CMOS solid-state image pickup device according to a seventh embodiment of the invention. FIG. 11 illustrates a schematic cross sectional structure of main components in an area corresponding to a unit pixel in an image pickup area where a plurality of the pixels is arrayed in a two-dimensional array shape.

The solid-state image pickup device 61 according to the seventh embodiment is configured by disposing a transistor 62 which becomes an active element on the photodiode PD so as to be superimposed thereon. The transistor 62 may be formed as a thin film transistor which is formed by using a back-end process. The thin film transistor 62 includes a semiconductor thin film 63 of polycrystalline silicon, amorphous silicon, or the like, a gate insulating film (for example, a gate oxide film) 64, and a gate electrode 65, and the thin film transistor 62 is configured by forming a source region and a drain region in the semiconductor thin film 63. The gate electrode 65 may be formed by a metal wire line or polysilicon. Besides the silicon, a compound semiconductor thin film of ZnO, or the like may be used as the semiconductor thin film 63. The thin film transistor 62 may be a transistor which is used as a circuit of reading an output of the photodiode PD, that is, a pixel transistor. In the case where the thin film transistor 62 is a pixel transistor, a transistor selected from a portion or all of the transistors excluding the transfer transistor Tr1, for example, the reset transistor Tr2, the amplifying transistor, and the selecting transistor in the case of the four transistors may be used.

A wire line 37 having a plurality of layers is formed through an interlayer insulating film above the thin film transistor 62. Since other configurations are the same as those described in the first embodiment, in FIG. 11, the components corresponding to FIG. 3 are denoted by the same reference numerals, and the description thereof is omitted.

In the solid-state image pickup device 61 according to the seventh embodiment, since a portion or all of the pixel transistors formed by using the thin film transistor 62 is disposed just above the photodiode PD, it is possible to improve the area efficiency of the photodiode PD, so that it is possible to improve sensitivity characteristics. Therefore, it is possible to miniaturize and highly integrate the pixels, so that it is possible to provide a high quality solid-state image pickup device.

9. Eighth Embodiment

Example of Configuration of Solid-State Image Pickup Device

Figure 12:
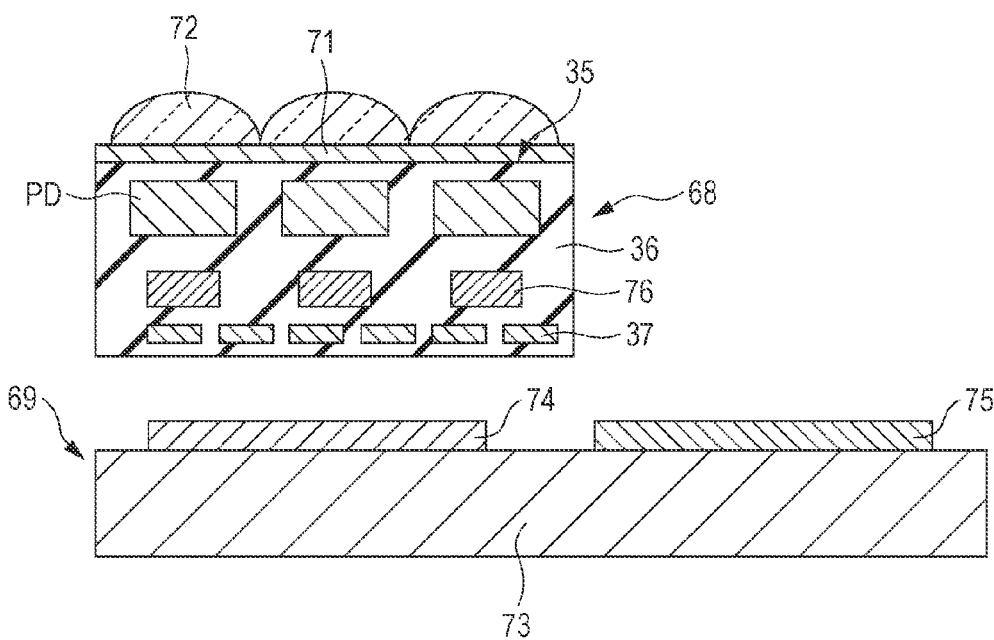
FIG. 12 is a schematic configuration diagram illustrating main components of the solid-state image pickup device according to an eighth embodiment of the invention.

FIG. 12 illustrates a solid-state image pickup device according to an eighth embodiment of the invention, that is, a back side illuminated type CMOS solid-state image pickup device. FIG. 12 is a schematic configuration diagram diagrammatically illustrating the solid-state image pickup device according to the embodiment.

The solid-state image pickup device 67 according to the eighth embodiment is implemented by three-dimensionally laminating and assembling a first semiconductor chip 68 including an image pickup area where a plurality of pixels is arrayed in a two-dimensional array shape and a second semiconductor chip 69 including at least a logic circuit through connection using solder bumps or the like. The first semiconductor chip 68 is a so-called sensor chip including a back side illuminated type CMOS solid-state image pickup device. The second semiconductor chip 69 is a so-called logic chip including a memory LSI, a logic LSI, an A/D converter, and the like constituting a peripheral circuit.

The first semiconductor chip 68 is formed by arraying a plurality of pixels including the photodiode PD and a plurality of the pixel transistors in the image pickup area in a two-dimensional array shape. The wire lines 37 of a plurality of layers are formed through the interlayer insulating films 36 in the front surface side of the substrate. A color filter 71 and an on-chip lens 72 are formed on the rear surface side of the substrate, which becomes the light receiving plane 35. The second semiconductor chip 69 is configured by forming a memory LSI 74, an A/D converter 75, a logic LSI, and the like on the semiconductor substrate 72. The second semiconductor chip 69 has a function as a support substrate for the thinned first semiconductor chip 68.

In the embodiment, a circuit element 76 which becomes the aforementioned active element or passive element is formed in the front surface of the substrate opposite to the light receiving plane 35 so as to be superimposed on the photodiode PD by using a wire line of a back-end process. Similarly to the aforementioned embodiment, as the active element, a transistor, for example, a pixel transistor may be used. Similarly to the aforementioned embodiment, as the passive element, a capacitance element, for example, a capacitance element for charge storage, or a capacitance element included in an A/D converter, a correlated double sampling circuit, or the like may be used. In addition, similarly to the aforementioned embodiment, as the passive element, an inductance element and/or a resistance element may be used.

In the laminated configuration of the sensor chip and the logic chip, the light generated by the so-called cross talk where noise generated from the logic LSI influences a solid-state image pickup device or by hot carriers in transistors included in the logic LSI or the like is incident to the solid-state image pickup device to become noise.

However, in the solid-state image pickup device 67 according to the eighth embodiment, the element 76 which becomes an active element or a passive element is formed in the front surface side of the substrate opposite to the light receiving plane 35 so as to be superimposed on the photodiode PD. Disturbance noise such as an electrical noise and optical noise, which is generated by the second semiconductor chip 69 to the photodiode PD, may be shielded by the element 76. At this time, a metal used for the active element or the passive element is configured as a metal having a high light reflectance so as to more securely perform the shielding. Table 1 lists the reflectance of metals with respect to light having various wavelengths.

TABLE 1

| | Reflectance (%) of Metal | | | | | | | |
|---|---|---|---|---|---|---|---|---|
| Wavelength (nm) | Ag | Al | Au | Cu | Ni | Pt | Rh | Sn |
| UV (280) | 25.2 | 92.3 | 37.8 | 33.0 | 37.6 | 43.1 | 68.5 | 17 (251 nm) |
| violet (400) | 94.8 | 92.4 | 38.7 | 47.5 | 41.2 (361 nm) | 52.4 (361 nm) | 77.6 | 27.0 (357 nm) |

TABLE 1-continued

| | Reflectance (%) of Metal | | | | | | | |
|---|---|---|---|---|---|---|---|---|
| Wavelength (nm) | Ag | Al | Au | Cu | Ni | Pt | Rh | Sn |
| red (700) | 98.5 | 89.9 | 97.0 | 97.5 | 68.8 | 69.0 | 80.4 | |
| IR (1000) | 98.9 | 83.9 | 98.2 | 98.5 | 72.0 | 77.0 | 85.0 | |

As listed in Table 1, Ag, Al, Rh, or the like of which the reflectance is high over the light in all wavelength ranges may be very suitably used as a material of an active element or a passive element.

In the solid-state image pickup device 67 according to the eighth embodiment, particularly, when the passive element is formed by using a metal wire line and disposed so as to be superimposed on the photodiode PD, it is possible to more securely shield disturbance noise without increasing the number of manufacturing processes. In addition, it is possible to improve the area efficiency of the photodiode PD, so that it is possible to improve sensitivity characteristics. Therefore, it is possible to miniaturize and highly integrate the pixels, so that it is possible to provide a high quality solid-state image pickup device.

10. Ninth Embodiment

Example of Method of Manufacturing Solid-State Image Pickup Device

Figure 13A:
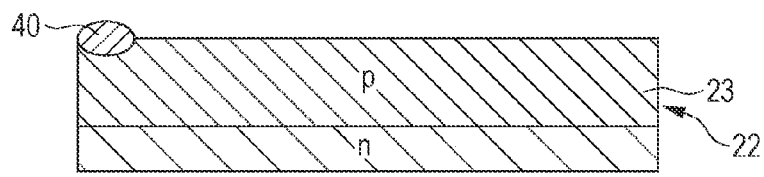
FIGS. 13A to 13E are manufacturing process diagrams illustrating a method of manufacturing a solid-state image pickup device according to a ninth embodiment of the invention.

FIGS. 13A to 13D illustrate a method of manufacturing a solid-state image pickup device according to a ninth embodiment of the invention. First, as illustrated in FIG. 13A, by an impurity ion injection method and a thermal diffusion method, a second conductivity type, for example, a p-type semiconductor well area 23 is formed in a first conductivity type, an n-type silicon semiconductor substrate 22, and an element isolation region 40 is formed. The semiconductor substrate 22 may include an epitaxial growing layer.

In addition, the semiconductor well area 23 of the different conductivity type may be formed in the same substrate. In other words, the p-type semiconductor well area may be formed in the n-type semiconductor substrate, and the n-type semiconductor well area may be formed in the p-type semiconductor well area. Otherwise, the opposite n-type semiconductor well area may be formed in the p-type semiconductor substrate, and the p-type semiconductor well area may be formed in the n-type semiconductor well area. The element isolation region 40 may include a silicon thermal oxide film or a deposited silicon oxide film, or the element isolation region 40 may be formed by using an impurity diffusion film.

Figure 13B:
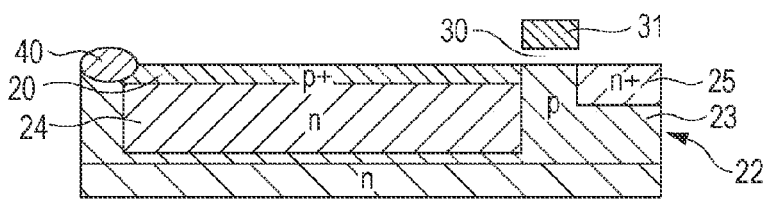

Next, as illustrated in FIG. 13B, the photodiode PD is formed by forming an n-type semiconductor area 24 in the semiconductor well area 23 and a p-type semiconductor area 20 on the surface thereof. In addition, another n-type source/drain region constituting the pixel transistor including an n-type semiconductor area 25, which becomes a floating diffusion portion FD, is formed in the semiconductor well area 23 so as to be adjacent to the photodiode PD. The semiconductor areas 23, 24, and 25 or the like are formed by using an ion injection method, a thermal diffusion method, or the like. In addition, the gate insulating film 30 and the gate electrode 31 of the pixel transistor are formed. The gate insulating film 30 and the gate electrode 31 are formed by using a chemical thin film deposition method and a lithography technology, a dry etching technology, or the like. The gate insulating film 30 may be formed by using a silicon oxide film and a silicon nitride film containing nitrogen, or a material including hafnium, tantalum, or the like. In addition, the gate electrode 31 may be formed by using polysilicon, silicide, or a metal. The n-type source/drain region, the p-type source/drain region, the gate insulating film, and the gate electrode constituting the CMOS transistor are formed in the peripheral circuit formation area. The source/drain region of the MOS transistor including the pixel transistor may be formed after the gate electrode is formed.

Figure 13C:
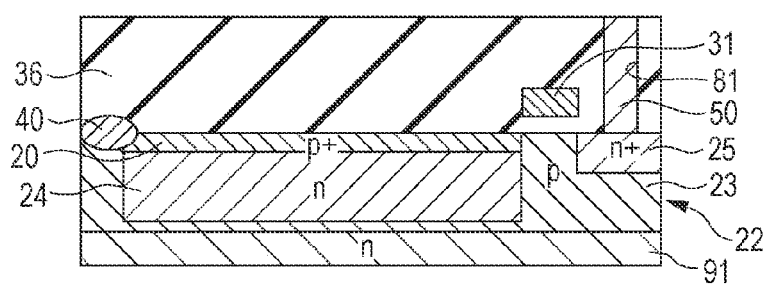

After the so-called front-end process is finished as above, the so-called back-end process proceeds. In other words, as illustrated in FIG. 13C, the interlayer insulating film 36 is formed by a chemical vapor deposition method, and a contact hole 81 for contacting with, for example, the n-type semiconductor area 25 is formed in the interlayer insulating film 36 by dry etching. A connection conductor 50 made of a metal, for example, tungsten is buried in the contact hole 81. At this time, by performing a metal thin film deposition according to a sputter method and, after that, performing patterning according to a chemical mechanical polishing method, a metal thin film is remained in only the contact hole 81 formed in the interlayer insulating film 36, so that a connection conductor 50 is formed.

Next, the multi-layered wire line layer in which wire lines of a plurality of layer are formed through the interlayer insulating films is formed, and at this time, the element which becomes the passive element or the active element as described above is formed so as to be superimposed on the photodiode PD by using the wire line. The passive element is the aforementioned capacitance element, inductance element, resistance element, or the like. The active element is the aforementioned pixel transistor.

Figure 13D:
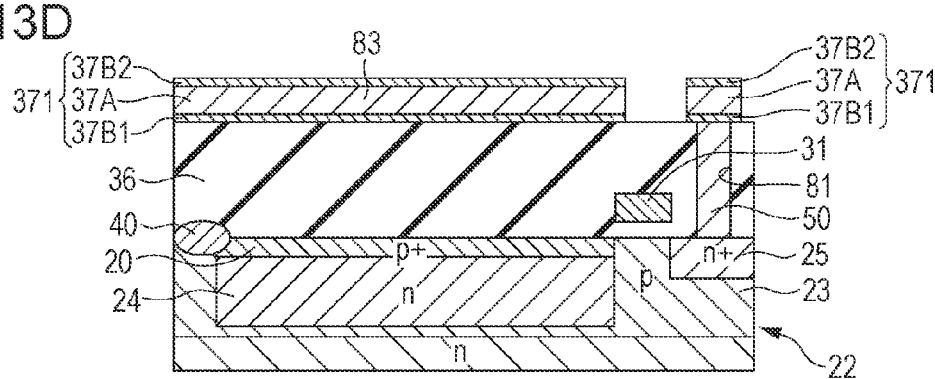

In this embodiment, as illustrated in FIG. 13D, a metal layer constructed with a first barrier metal 37B1, a wire line 37A, and a second barrier metal 137B2 is formed by a sputter method or the like, and patterning is performed by a lithography method and a dry etching method. By the patterning, the wire line 371 of the first layer including the one electrode 83 which becomes the capacitance element is formed.

Figure 13E:
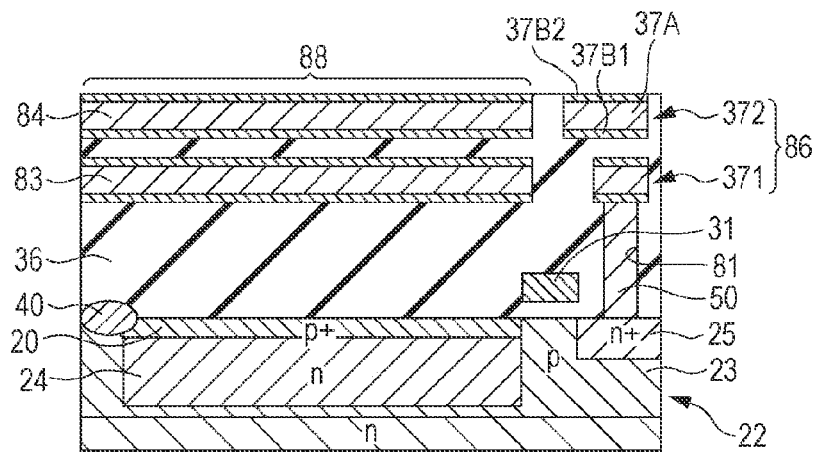

Next, as illustrated in FIG. 13E, the interlayer insulating film 36 and the wire line 372 of the second layer including the other electrode 84 which becomes the capacitance element on the interlayer insulating film 36 is formed by the same process. The capacitance element 88 which is a passive element is formed by the electrode 83 of the wire line of the first layer, the electrode 84 of the wire line of the second layer, and the interlayer insulating film 36 therebetween. The capacitance element 88 is formed on the photodiode PD. In this embodiment, although the multi-layered wire line layer 86 is configured by disposing the wire lines 371 and 372 of the two layers, the multi-layered wire line layer 86 may be configured with a structure where the wire lines of three or more layers are disposed. As the capacitance element 88, a capacitance element for charge storage in a pixel, a capacitance element of an A/D converter, a capacitance element of a correlated double sampling circuit, or the like may be used.

Figure 14:
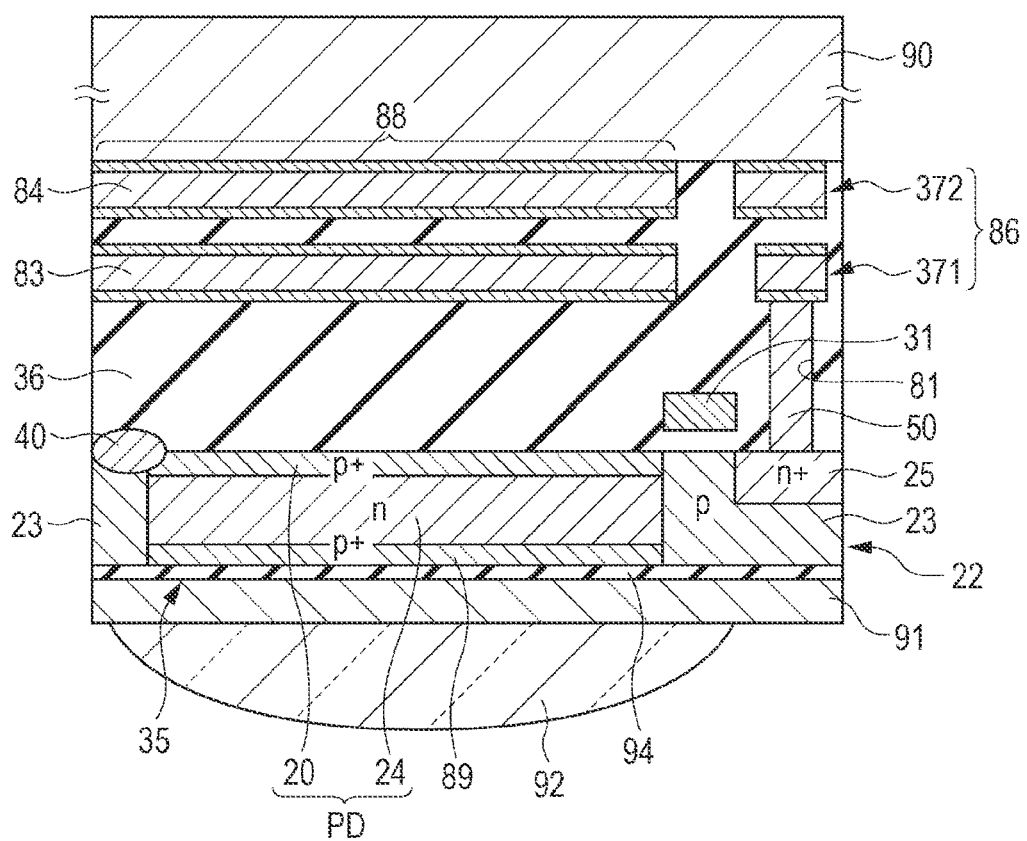
FIG. 14 is a schematic cross-sectional diagram illustrating the solid-state image pickup device obtained by the manufacturing method according to the ninth embodiment of the invention.

Next, similarly as illustrated in FIG. 14, a support substrate 90, for example, a silicon substrate is adhered on the multi-layered wire line layer 86, and the semiconductor substrate 22 is thinned by polishing the rear surface side by a chemical mechanical polishing method or the like. A p-type semiconductor area 89 for suppressing dark currents, a color filter 91, an on-chip lens 92, and the like are formed through the insulating films 93 in the rear surface of the thinned substrate, so that a desired back side illuminated type solid-state image pickup device is obtained.

In addition, in the embodiment, although the capacitance element 88 is formed by using the wire line 371 of the first layer and the wire line 372 of the second layer, the capacitance element 88 may be formed by using the wire lines of other layers.

In the method of manufacturing a solid-state image pickup device according to the ninth embodiment, since the capacitance element 88 is formed in the front surface side of the substrate so as to be superimposed on the photodiode PD, it is possible to improve the area efficiency of the photodiode PD, so that it is possible to manufacture a back side illuminated type solid-state image pickup device with a high sensitivity. Therefore, it is possible to miniaturize and highly integrate the pixels, so that it is possible to provide a high quality solid-state image pickup device.

11. Tenth Embodiment

Example of Method of Manufacturing Solid-State Image Pickup Device

In a method of manufacturing a solid-state image pickup device according to a tenth embodiment of the invention, although not shown, an inductance element and/or a resistance element which are passive elements are formed by using, for example, the wire line 371 of the first layer in the ninth embodiment. The other processes are the same as those of the ninth embodiment, and thus, the description thereof is omitted. Accordingly, a desired back side illuminated type solid-state image pickup device where an inductance element and/or a resistance element are disposed on the photodiode PD is obtained. In addition, the inductance element and/or the resistance element may be formed by using the wire lines of the second layer or later.

In the method of manufacturing a solid-state image pickup device according to the tenth embodiment, since the inductance element and/or the resistance element which become passive elements are formed on the photodiode PD, it is possible to improve the area efficiency of the photodiode PD, so that it is possible to manufacture a back side illuminated type solid-state image pickup device with a high sensitivity. Accordingly, it is possible to miniaturize and highly integrate the pixels, so that it is possible to manufacture a high quality solid-state image pickup device.

12. Eleventh Embodiment

Example of Method of Manufacturing Solid-State Image Pickup Device

Figure 15A:
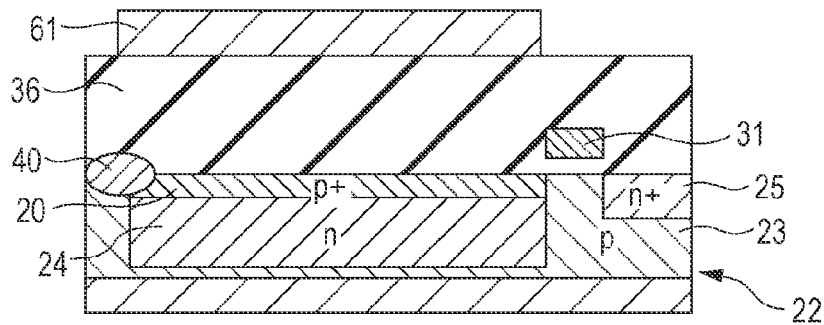
FIGS. 15A to 15C are manufacturing process diagrams illustrating a method of manufacturing a solid-state image pickup device according to an eleventh embodiment of the invention.
Figure 15B:
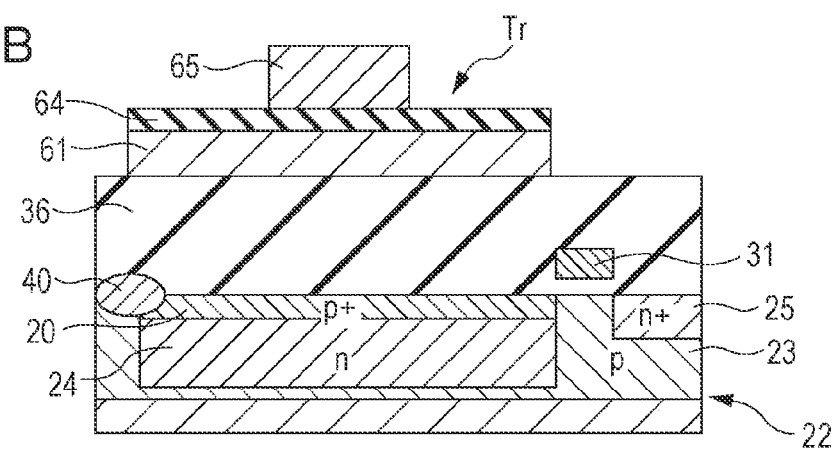
Figure 15C:
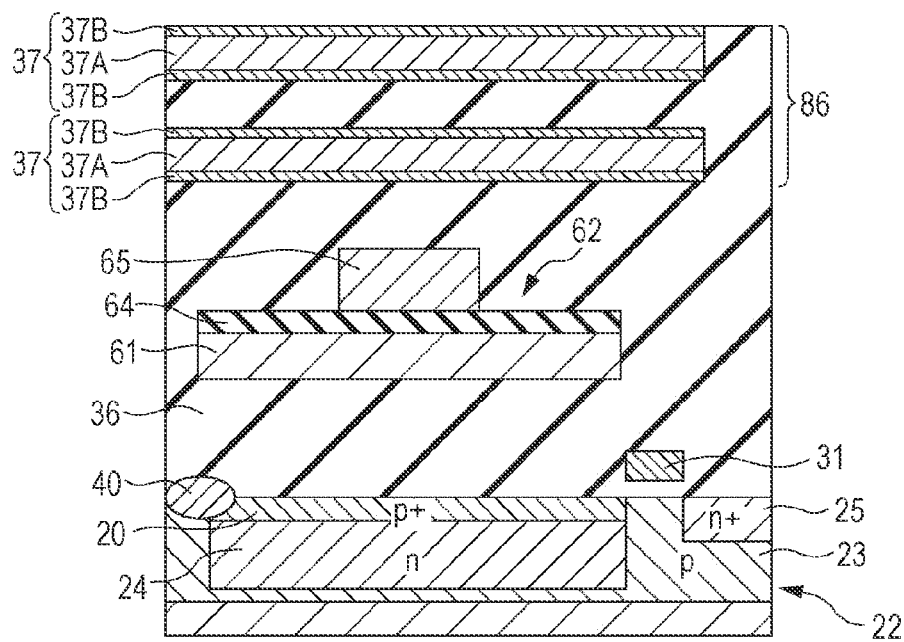

FIGS. 15A to 15C illustrate a method of manufacturing a solid-state image pickup device according to an eleventh embodiment of the invention. The embodiment is an example of a method of manufacturing a solid-state image pickup device where an active element, which is a thin film transistor in this example, is disposed on a photodiode PD. Similarly to the aforementioned ninth embodiment, in the embodiment, the processes of FIGS. 13A to 13C are performed until the interlayer insulating film 36 is formed. The processes up to this point are the same, and thus, the description thereof is omitted.

Next, as illustrated in FIG. 15A, after a polycrystalline silicon film, an amorphous silicon film, or the like is deposited by a chemical vapor deposition method or a sputtering method, a semiconductor thin film 63 which is an active layer of a thin film transistor is formed by a lithography method or a dry etching method. The semiconductor thin film 63 is formed on the photodiode PD.

Next, as illustrated in FIG. 15B, a gate electrode 65 is formed through a gate insulating film 64 on the semiconductor thin film. At this time, the semiconductor thin film 63 of polysilicon or amorphous silicon is added with necessary impurities by an ion injection method, a thermal diffusion method, or the like so as to be able to perform transistor operations. In this manner, the thin film transistor 62 which becomes the pixel transistor is formed.

Next, as illustrated in FIG. 15C, a multi-layered wire line layer 86, in which wire lines 37 of a plurality of layers are formed through the interlayer insulating films 36, is formed. The wire line 37 may be formed in a configuration having a bimetal as described with reference to FIGS. 13A to 13E.

Figure 16:
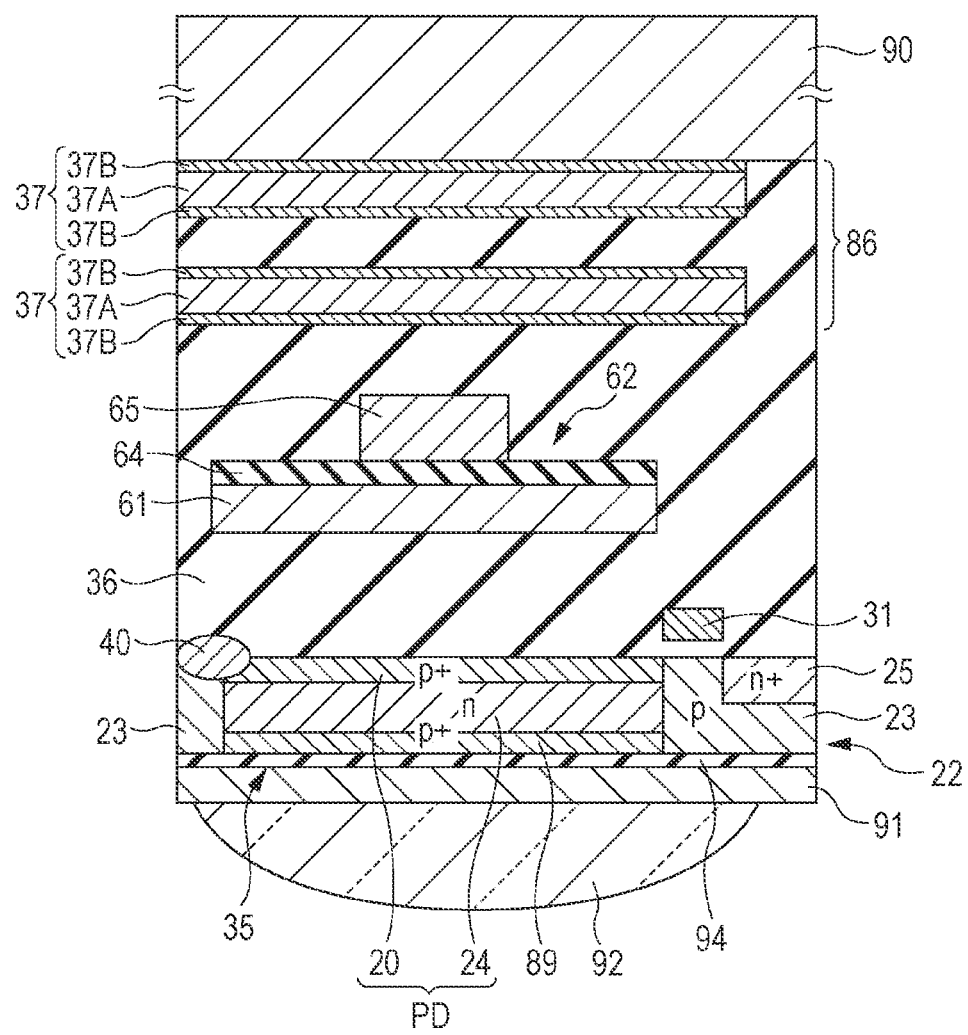
FIG. 16 is a schematic cross-sectional diagram illustrating the solid-state image pickup device obtained by the manufacturing method according to the eleventh embodiment of the invention.

Next, similarly as illustrated in FIG. 14, a support substrate 90, for example, a silicon substrate is adhered on the multi-layered wire line layer 86, and the semiconductor substrate 22 is thinned by polishing the rear surface side by a chemical mechanical polishing method or the like. A p-type semiconductor area 89 for suppressing dark currents, a color filter 91, an on-chip lens 92, and the like are formed through insulating films in the rear surface of the thinned substrate, so that a desired back side illuminated type solid-state image pickup device illustrated in FIG. 16 is obtained.

In the method of manufacturing a solid-state image pickup device according to the eleventh embodiment, since the pixel transistor 62 is formed in the front surface side of the substrate so as to be superimposed on the photodiode PD, it is possible to improve the area efficiency of the photodiode PD, so that it is possible to manufacture a back side illuminated type solid-state image pickup device with a high sensitivity. Therefore, it is possible to miniaturize and highly integrate the pixels, so that it is possible to manufacture a high quality solid-state image pickup device.

The aforementioned method of manufacturing a solid-state image pickup device may be used to manufacture the solid-state image pickup devices according to the first to eighth embodiments.

A unit pixel (non-shared type) constructed with one photodiode and a plurality of pixel transistors, for example, four transistors or three transistors may be used as the pixel in the CMOS solid-state image pickup devices according to the aforementioned embodiments. Alternatively, a shared pixel (shared type) where one pixel transistor portion is shared by a plurality of photodiodes may be used.

In addition, in the solid-state image pickup devices according to the aforementioned embodiments, signal charges are electrons, and the first and second conductivity types are configured as the n type and the p type. However, the invention may be adapted to a solid-state image pickup device where the signal charges are holes. In this case, the conductivity types of the semiconductor substrate, the semiconductor well area, or the semiconductor area are reversed, so that the p type becomes the first conductivity type, and the n type becomes the second conductivity type.

13. Twelfth Embodiment

Example of Configuration of Electronic Apparatus

The aforementioned solid-state image pickup device according to the invention may be adapted to an electronic apparatus, for example, a camera system such as a digital camera or a video camera, a mobile phone having a photographing function, or other apparatuses having a photographing function.

Figure 17:
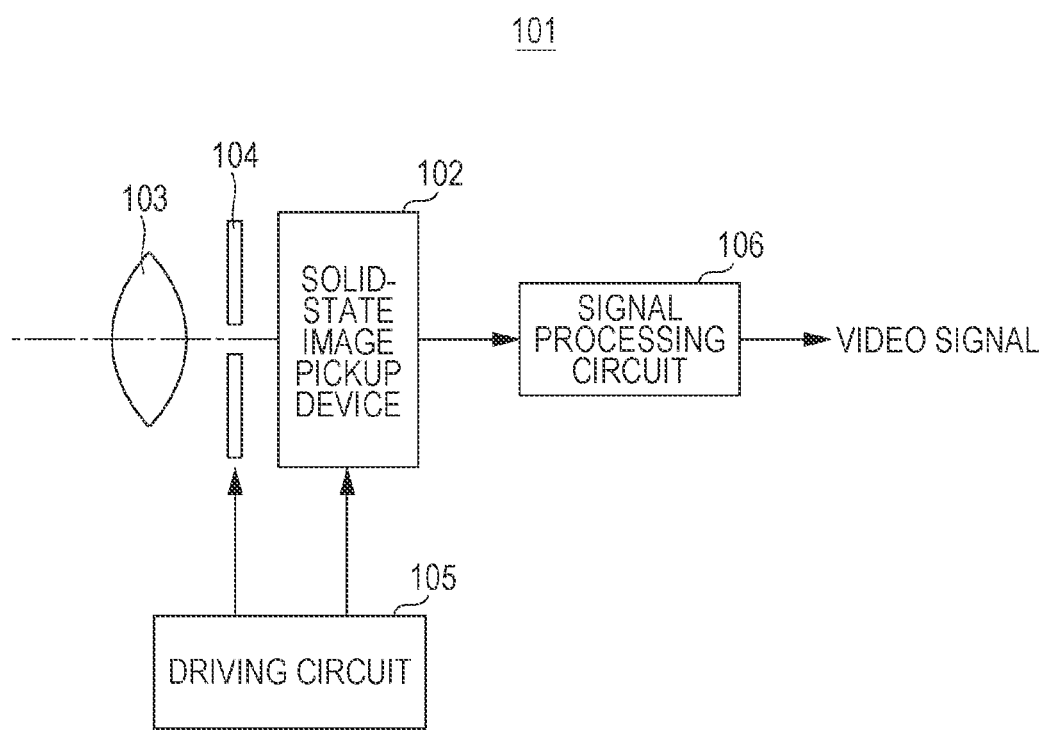
FIG. 17 is a schematic configuration diagram illustrating an electronic apparatus according to the sixth embodiment of the invention.
Figure 18:
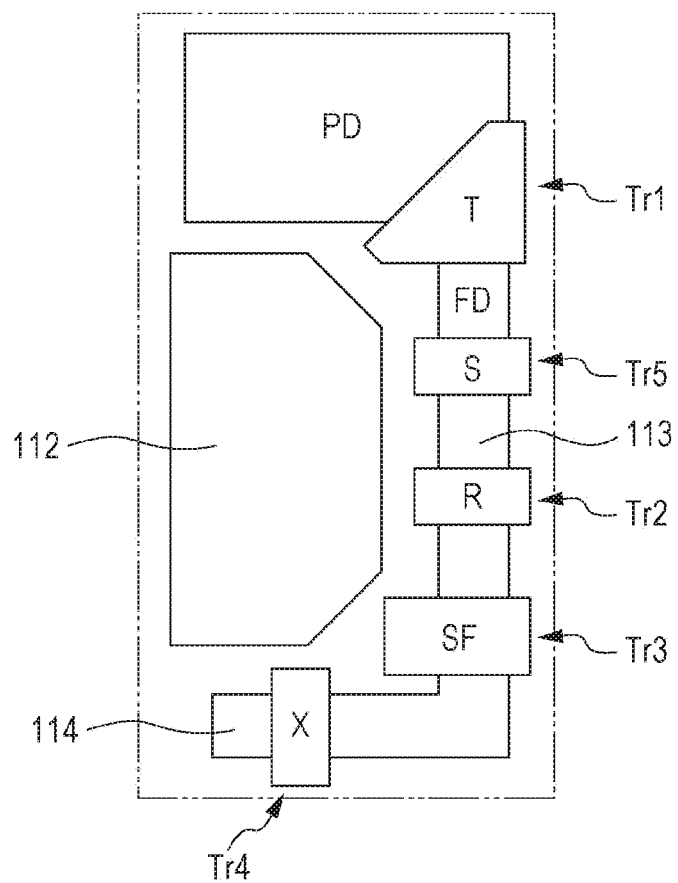
FIG. 18 is a schematic configuration diagram illustrating an example of a solid-state image pickup device in the related art.
Figure 19:
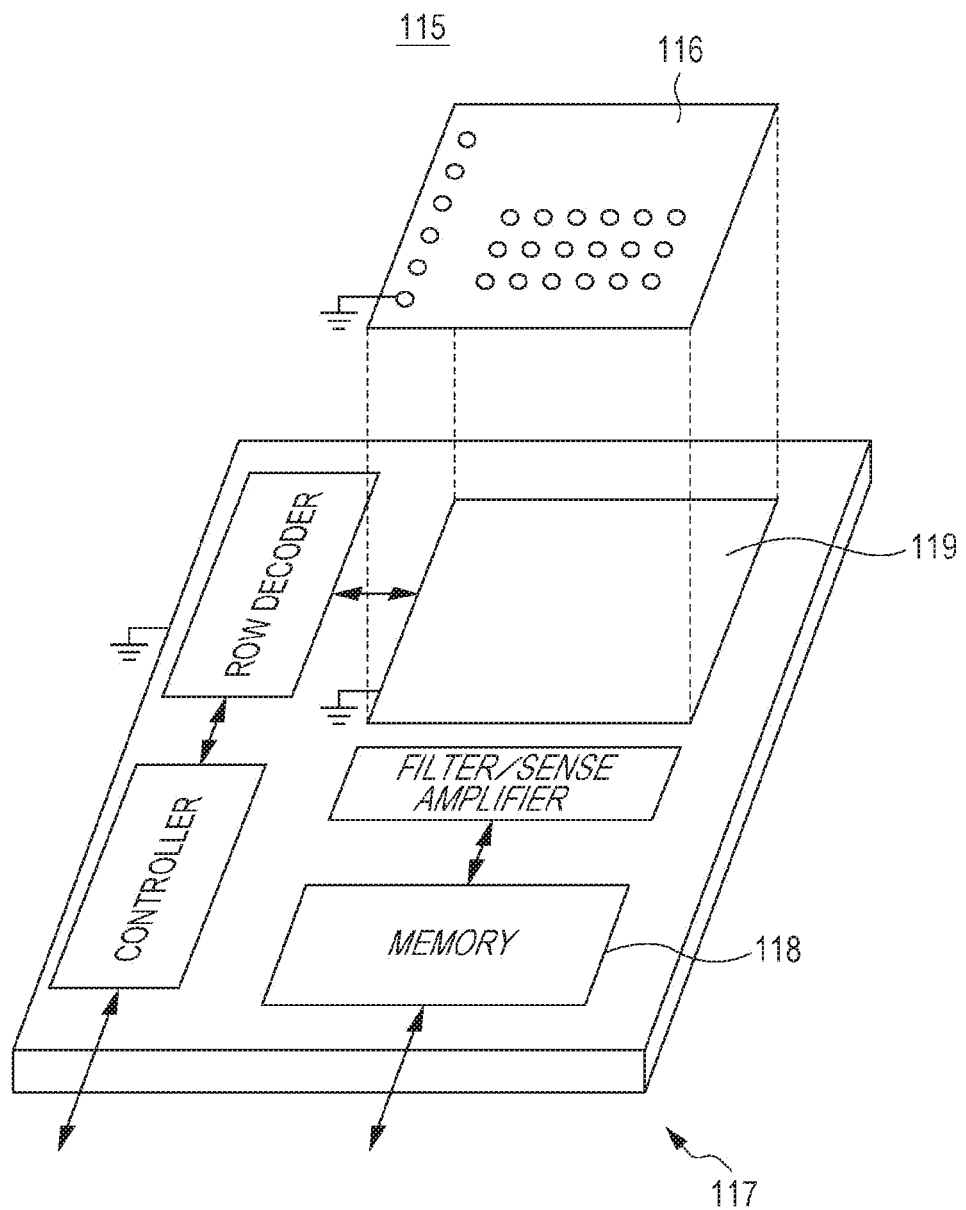
FIG. 19 is a schematic configuration diagram illustrating another example of a solid-state image pickup device in the related art.

FIG. 17 illustrates a camera as an example of the electronic apparatus according to a twelfth embodiment of the invention. The camera according to the embodiment is an example of a video camera capable of photographing a still image or a moving picture. The camera 101 according to the embodiment includes a solid-state image pickup device 102, an optical system 103 which guides incident light to a light receiving sensor portion of the solid-state image pickup device 102, and a shutter unit 104. In addition, the camera 101 includes a driving circuit 105 which drives the solid-state image pickup device 102 and a signal processing circuit 106 which processes an output signal of the solid-state image pickup device 102.

One of the solid-state image pickup devices of the aforementioned embodiments is used as the solid-state image pickup device 102. The optical system (optical lens) 103 focuses image light (incident light) from a subject on an imaging plane of the solid-state image pickup device 102. Accordingly, signal charges are accumulated in the solid-state image pickup device 102 for a predetermined time period. The optical system 103 may be an optical lens system constructed with a plurality of optical lenses. The shutter unit 104 controls a light illuminating time period and a light shielding time period for the solid-state image pickup device 132. The driving circuit 105 supplies driving signals for controlling the transfer operation of the solid-state image pickup device 132 and the shutter operation of the shutter unit 104. By the driving signals (timing signals) supplied from the driving circuit 105, the signal transfer of the solid-state image pickup device 102 is performed. The signal processing circuit 106 performs various signal processes. A video signal which is subject to the signal processes is stored in a storage medium such as a memory or output to a monitor.

In the electronic apparatus such as a camera according to the twelfth embodiment, as described above, it is possible to improve the area efficiency of the photodiode PD in the solid-state image pickup device 102, so that it is possible to reduce disturbance noise. Accordingly, it is possible to provide an apparatus such as a camera with a high quality.

The present application contains subject matter related to that disclosed in Japanese Priority Patent Application JP 2010-068879 filed in the Japan Patent Office on Mar. 24, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:
   a semiconductor substrate including a front surface side, a rear surface side, and an interior between the front surface side and the rear surface side;
   a plurality of pixels, at least one pixel including a photoelectric conversion portion configured to receive incident light traveling from the rear surface side, the photoelectric conversion portion disposed within the interior at the rear surface side, and an imaging pixel transistor disposed within the interior at the front surface side, wherein the rear surface side corresponds to a light receiving plane of the photoelectric conversion portion; and
   an active or passive pixel element disposed within the interior at the front surface side so as to be superimposed on the photoelectric conversion portion.

2. The solid-state image pickup device according to claim 1, wherein the passive pixel element is a capacitance element comprising a wire line and an interlayer insulating film disposed within the front surface side.

3. The solid-state image pickup device according to claim 2, wherein the capacitance element is configured to store charges transferred from the photoelectric conversion portion.

4. The solid-state image pickup device according to claim 2, wherein the capacitance element is an analog/digital conversion circuit.

5. The solid-state image pickup device according to claim 1, wherein the passive pixel element is an inductance element and/or a resistance element.

6. The solid-state image pickup device according to claim 1, wherein the active pixel element is a transistor element.

7. The solid-state image pickup device according to claim 6, wherein the transistor element is a pixel transistor.

8. The solid-state image pickup device according to claim 1, further comprising:
   a semiconductor imaging chip including an image pickup area comprising the plurality of the pixels arranged in a two-dimensional array shape; and
   a semiconductor logic chip including at least a logic circuit,
   wherein the imaging and logic chips are laminated together.

9. A method of manufacturing a solid-state image pickup device, comprising:
   providing a semiconductor substrate including a front surface side, a rear surface side, and an interior between the front surface side and the rear surface side;
   forming a plurality of pixels in the semiconductor substrate, at least one pixel including a photoelectric conversion portion configured to receive incident light traveling from the rear surface side, the photoelectric conversion portion disposed within the interior at the rear surface side, and an imaging pixel transistor disposed within the interior at the front surface side, wherein the rear surface side corresponds to a light receiving plane of the photoelectric conversion portion; and
   forming an active or passive pixel element disposed within the interior at the front surface side so as to be superimposed on the photoelectric conversion portion.

10. The method according to claim 9, further comprising, after the step of forming the plurality of pixels, the step of forming wire lines of a plurality of layers through interlayer insulating films disposed within the front surface side and thereby forming the passive pixel circuit element.

11. The method according to claim 10, wherein the passive pixel element is a capacitance element.

12. The method according to claim 10, wherein the passive pixel element is an inductance element and/or a resistance element.

13. The method according to claim 9, further comprising, after the step of forming the plurality of pixels, the steps of forming the active pixel element on the front surface side and forming wire lines of a plurality of layers through interlayer insulating films.

14. The method according to claim 13, wherein the active pixel element is a transistor element.

15. An electronic apparatus comprising:
a solid-state image pickup device;
an optical system configured to guide incident light to a photodiode of the solid-state image pickup device; and
a signal processing circuit configured to perform a process on an output signal of the solid-state image pickup device,
wherein the solid-state image pickup device comprises:
  a semiconductor substrate including a front surface side, a rear surface side, and an interior between the front surface side and the rear surface side;
  a plurality of pixels, at least one pixel including a photoelectric conversion portion configured to receive incident light traveling from the rear surface side, the photoelectric conversion portion disposed within the interior at the rear surface side, and an imaging pixel transistor disposed within the interior at the front surface side, wherein the rear surface side corresponds to a light receiving plane of the photoelectric conversion portion; and
  an active or passive pixel element disposed within the interior at the front surface side so as to be superimposed on the photoelectric conversion portion.

16. The electronic apparatus according to claim 15, wherein the passive pixel element is a capacitance element comprising a wire line and an interlayer insulating film disposed within the front surface side.

17. The electronic apparatus according to claim 16, wherein the capacitance element is configured to store charges transferred from the photoelectric conversion portion.

18. The electronic apparatus according to claim 16, wherein the capacitance element is an analog/digital conversion circuit.

19. The electronic apparatus according to claim 15, wherein the passive pixel element is an inductance element and/or a resistance element.

20. The electronic apparatus according to claim 15, wherein the active pixel element is a transistor element.

21. The electronic apparatus according to claim 20, wherein the transistor element is a pixel transistor.

22. The electronic apparatus according to claim 15, further comprising:
a semiconductor imaging chip including an image pickup area comprising the plurality of the pixels arranged in a two-dimensional array shape; and
a semiconductor logic chip including at least a logic circuit,
wherein the imaging and logic chips are laminated together.

* * * * *